US012685056B2

(12) United States Patent
Hanawa et al.

(10) Patent No.: US 12,685,056 B2
(45) Date of Patent: Jul. 14, 2026

(54) SUBSTRATE TREATING METHOD AND SUBSTRATE TREATING APPARATUS

(71) Applicant: SCREEN Holdings Co., Ltd., Kyoto (JP)

(72) Inventors: Yosuke Hanawa, Kyoto (JP); Dai Ueda, Kyoto (JP); Akiko Harumoto, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 133 days.

(21) Appl. No.: 18/550,617

(22) PCT Filed: Jan. 20, 2022

(86) PCT No.: PCT/JP2022/001981
§ 371 (c)(1),
(2) Date: Sep. 14, 2023

(87) PCT Pub. No.: WO2022/196086
PCT Pub. Date: Sep. 22, 2022

(65) Prior Publication Data
US 2024/0170297 A1     May 23, 2024

(30) Foreign Application Priority Data
Mar. 15, 2021     (JP) ................................. 2021-041310

(51) Int. Cl.
*H10P 50/28*          (2026.01)
*H10P 72/00*          (2026.01)
(52) U.S. Cl.
CPC ........ *H10P 50/283* (2026.01); *H10P 72/0424* (2026.01); *H10P 72/0604* (2026.01)

(58) Field of Classification Search
None
See application file for complete search history.

(56) References Cited

U.S. PATENT DOCUMENTS

| | | | | |
|---|---|---|---|---|
| 4,319,923 A | * | 3/1982 | Falanga | ................... C23F 1/46 |
| | | | | 75/741 |
| 10,377,948 B2 | * | 8/2019 | Lee | ........................ C09K 13/04 |

(Continued)

FOREIGN PATENT DOCUMENTS

| | | |
|---|---|---|
| JP | H01-184281 A | 7/1989 |
| JP | H08-241873 A | 9/1996 |

(Continued)

OTHER PUBLICATIONS

Notice of Allowance dated Jan. 21, 2025 for corresponding Korean Patent Application No. 10-2023-7025498.

(Continued)

*Primary Examiner* — Shamim Ahmed
(74) *Attorney, Agent, or Firm* — OSTROLENK FABER LLP

(57) ABSTRACT

This disclosure relates to a substrate treating method and a substrate treating apparatus. An additive is dissolved in a first treatment liquid. The first treatment liquid contains iodide ions (I⁻). The substrate treating method includes an adjusting step and a supplying step. In the adjusting step, decrease in iodide ions (I⁻) contained in the first treatment liquid is suppressed. Accordingly, the first treatment liquid contains a sufficient amount of iodide ions (I⁻). In the supplying step, the first treatment liquid adjusted in the adjusting step is supplied to a substrate. Moreover, in the supplying step, a first etchant for etching the substrate is supplied to the substrate.

13 Claims, 9 Drawing Sheets

(56)  References Cited

U.S. PATENT DOCUMENTS

| 2008/0242103 | A1 |   | 10/2008 | Ohmuro et al. |
| 2014/0091052 | A1 | * | 4/2014 | Nagashima ............... C23F 1/44 |
|   |   |   |   | 216/13 |
| 2017/0178923 | A1 |   | 6/2017 | Surla et al. |
| 2021/0276052 | A1 |   | 9/2021 | Iwasaki et al. |
| 2022/0041931 | A1 |   | 2/2022 | Oshio et al. |
| 2022/0325205 | A1 | * | 10/2022 | Shimoda ........... H01L 21/02087 |
| 2022/0411937 | A1 | * | 12/2022 | Sato .................. H01L 21/32134 |

FOREIGN PATENT DOCUMENTS

| JP | H09-022891 | A | 1/1997 |
| JP | H09-115875 | A | 5/1997 |
| JP | 2003-277956 | A | 10/2003 |
| JP | 2004-211142 | A | 7/2004 |
| JP | 2008-252025 | A | 10/2008 |
| JP | 2020-515047 | A | 5/2020 |
| KR | 10-2019-0137869 | A | 12/2019 |
| WO | WO 2020/129737 | A1 | 6/2020 |

OTHER PUBLICATIONS

International Search Report mailed Apr. 12, 2022 in corresponding PCT International Application No. PCT/JP2022/001981.

Written Opinion mailed Mar. 30, 2022 in corresponding PCT International Application No. PCT/JP2022/001981.

Office Action dated Apr. 30, 2026 for corresponding Chinese Patent Application No. 202280010961.3.

* cited by examiner

1

SUBSTRATE TREATING METHOD AND SUBSTRATE TREATING APPARATUS

CROSS-REFERENCE TO RELATED APPLICATIONS

The present application is a 35 U.S.C. §§ 371 national stage application of International Application No. PCT/JP2022/001981 filed Jan. 20, 2022, which claims priority to Japanese Patent Application No. 2021-041310, filed Mar. 15, 2021, the contents of which are incorporated herein by reference.

TECHNICAL FIELD

The present invention relates to a substrate treating method and a substrate treating apparatus for treating substrates. Examples of the substrates include a semiconductor wafer, a substrate for liquid crystal display, a substrate for organic electroluminescence (EL), a substrate for flat panel display (FPD), a substrate for optical display, a magnetic disk substrate, an optical disk substrate, a magneto-optical disk substrate, a substrate for photomask, and a solar cell substrate.

BACKGROUND ART

Patent Literatures 1 and 2 each disclose a substrate treating apparatus that supplies an etchant to substrates for performing etching on the substrates.

PRIOR ART DOCUMENT

Patent Literature

[Patent Literature 1]
  Japanese Patent Application Publication No. H09-22891A
[Patent Literature 2]
  Japanese Patent Application Publication No. H09-115875A

SUMMARY OF INVENTION

Technical Problem

In recent years, a finer pattern is formed on a surface of a substrate. The pattern includes a plurality of projections (structure) and a plurality of recesses (space). The projections are each formed with a silicon oxide ($SiO_2$) film, a silicon nitride (SiN) film, or a polysilicon film, for example. The recesses are adjacent to the projections. The projection corresponds to a wall defining the recess. The recess becomes narrow as the pattern is finer. For example, there is a case where a separation distance between two adjacent projections may be several ten nanometers or less. For example, there is a case where the recess has a width of only several ten nanometers or less.

Accordingly, there arises a case where an etchant is supplied to narrow recesses in the etching treatment. There arises a case where the narrow recesses of a substrate are etched with the etchant. However, a quality of the etching treatment may occasionally decrease depending on a size of the recesses. For example, with the narrow recesses, a substrate may be etched inappropriately in some cases. For example, with the narrow recesses, an etching function may decrease in some cases.

The present invention has been made regarding the state of the art noted above, and its one object is to provide a substrate treating method and a substrate treating apparatus that suitably etch substrates regardless of a size of recesses on the substrates.

Solution to Problem

To overcome the above drawbacks, Inventors of the present invention have made intensive research. Firstly, the Inventors focused on iodide ions ($I^-$). Iodide ions ($I^-$) have hydrophobicity. The projection on the substrate also has hydrophobicity. Accordingly, an affinity between the iodide ions ($I^-$) and the projection is better than an affinity between a water molecule and the projection.

Then, the Inventors made study to supply an etchant, containing iodide ions ($I^-$), to the substrates. The iodide ions ($I^-$) in the etchant enter the recesses of the substrate easily. The iodide ions ($I^-$) enter the recesses easily without depending on a size of the recesses. Even with narrow recesses, the iodide ions ($I^-$) enter easily in the recesses.

Here, the iodide ions ($I^-$) are anions. More specifically, the iodide ions ($I^-$) are monovalent monoatomic anions composed of one iodine atom. The etchant contains hydrogen ions ($H^+$). The hydrogen ions ($H^+$) are cations. Accordingly, the iodide ions ($I^-$) are movable along with the hydrogen ions ($H^+$) contained in a treatment liquid. In other words, the iodide ions ($I^-$) can promote movement of the hydrogen ions ($H^+$). This also causes the hydrogen ions ($H^+$) to enter the recesses easily regardless of a size of the recesses.

The hydrogen ion ($H^+$) is one of ions for etching the substrates. Accordingly, the substrates can be etched suitably regardless of a size of recesses.

On the other hand, the Inventors found a new drawback. The new drawback is a case where the etching function varies or decreases even with use of the etchant containing iodide ions ($I^-$). Then, Inventors herein have made a further study on the new drawback.

The present invention has been made based on the above finding through further studious consideration, and thus is constituted as stated below. One aspect of the present invention provides a substrate treating method for performing treatment on a substrate. The substrate treating method includes an adjusting step of suppressing decrease in iodide ions ($I^-$) contained in a first treatment liquid where an additive is dissolved, and a supplying step of supplying the first treatment liquid, adjusted in the adjusting step, and a first etchant for etching the substrate to the substrate.

The additive is dissolved in the first treatment liquid. The first treatment liquid contains iodide ions ($I^-$). The substrate treating method includes the adjusting step and the supplying step. In the adjusting step, decrease in iodide ions ($I^-$) contained in the first treatment liquid is suppressed. Accordingly, the first treatment liquid contains a sufficient amount of iodide ions ($I^-$). In the supplying step, the first treatment liquid adjusted in the adjusting step is supplied to the substrate. Moreover, the first etchant is supplied to the substrate in the supplying step. The first etchant is used for etching the substrate. Accordingly, the first etchant contains hydrogen ions ($H^+$). As described above, the first treatment liquid adjusted in the adjusting step contains a sufficient amount of iodide ions ($I^-$). This causes iodide ions ($I^-$) to enter recesses easily regardless of a size of the recesses on the substrate. This also causes the hydrogen ions ($H^+$) in the first etchant to enter the recesses easily along with the iodide ions (I⁻) regardless of the size of the recesses. As a result, the substrates can be etched suitably regardless of a size of recesses.

As described above, with the substrate treating method according to the present invention, substrates can be etched suitably regardless of the size of recesses on the substrates.

It is preferred in the substrate treating method described above that, in the supplying step, a mixed liquid, generated by adding the first treatment liquid adjusted in the adjusting step to the first etchant, is supplied to the substrate. In the supplying step, the mixed liquid is supplied to the substrate. Here, the mixed liquid is generated by adding the first treatment liquid adjusted in the adjusting step to the first etchant. That is, the mixed liquid contains the first treatment liquid and the first etchant. Accordingly, supplying the mixed liquid corresponds to supplying the first treatment liquid and the first etchant. Moreover, a feature that the mixed liquid contains the first treatment liquid and the first etchant corresponds to a feature that the mixed liquid contains iodide ions (I⁻) and hydrogen ions (H⁺). Accordingly, the iodide ions (I⁻) can satisfactorily promote movement of the hydrogen ions (H⁺) immediately after the mixed liquid is supplied to the substrate. Consequently, the substrate can be etched more suitably.

It is preferred in the substrate treating method mentioned above that the first treatment liquid is an aqueous solution in which the additive is dissolved in deionized water. Accordingly, in the adjusting step, decrease in iodide ions (I⁻) contained in the first treatment liquid can be suppressed easily.

Another aspect of the present invention provides a substrate treating method for performing treatment on a substrate. The substrate treating method includes an adjusting step of suppressing decrease in iodide ions (I⁻) contained in a first treatment liquid where an additive is dissolved, and a supplying step of supplying the first treatment liquid adjusted in the adjusting step to the substrate, and that the first treatment liquid further contains a second etchant for etching the substrate.

The additive is dissolved in the first treatment liquid. The first treatment liquid contains iodide ions (I⁻). The substrate treating method includes the adjusting step and the supplying step. In the adjusting step, decrease in iodide ions (I⁻) contained in the first treatment liquid is suppressed. Accordingly, the first treatment liquid contains a sufficient amount of iodide ions (I⁻). Moreover, the first treatment liquid contains the second etchant. The second etchant is used for etching substrates. Accordingly, the second etchant contains hydrogen ions (H⁺). As a result, the first treatment liquid contains hydrogen ions (H⁺). In summary, the first treatment liquid adjusted in the adjusting step contains a sufficient amount of iodide ions (I⁻). The first treatment liquid also contains hydrogen ions (H⁺). In the supplying step, the first treatment liquid adjusted in the adjusting step is supplied to the substrate. This causes iodide ions (I⁻) to enter the recesses easily along with the hydrogen ions (H⁺) regardless of a size of the recesses on the substrate. This causes the hydrogen ions (H⁺) to enter the recesses easily along with the iodide ions (I⁻) immediately after the first treatment liquid is supplied to the substrate. As a result, the substrates can be etched suitably regardless of a size of recesses.

As described above, with the substrate treating method according to the present invention, substrates can be etched suitably regardless of the size of recesses on the substrates.

It is preferred in the substrate treating method mentioned above that the additive releases the iodide ions (I⁻) therefrom into the first treatment liquid. Iodide ions (I⁻) are released from the additive in the first treatment liquid. Accordingly, the first treatment liquid can contain iodide ions (I⁻) satisfactorily.

It is preferred in the substrate treating method described above that the additive contains at least one selected from tetramethylammonium iodide (TMAI), tetraethylammonium iodide (TEAI), tetrapropylammonium iodide (TPAI), tetrabutylammonium iodide, ammonium iodide, and hydrogen iodide. The first treatment liquid can contain iodide ions (I⁻) satisfactorily.

It is preferred in the substrate treating method mentioned above that a concentration of dissolved oxygen in the first treatment liquid is lowered in the adjusting step. In the adjusting step, decrease in iodide ions (I⁻) contained in the first treatment liquid can be suppressed satisfactorily.

It is preferred in the substrate treating method mentioned above that inert gas is supplied into the first treatment liquid to generate gas bubbles in the first treatment liquid in the adjusting step. In the adjusting step, the concentration of dissolved oxygen in the first treatment liquid can be lowered satisfactorily.

It is preferred in the substrate treating method mentioned above that the first treatment liquid is degassed in the adjusting step. In the adjusting step, decrease in iodide ions (I⁻) contained in the first treatment liquid can be suppressed satisfactorily.

It is preferred in the substrate treating method mentioned above that a gas-liquid separating unit filters the first treatment liquid to degas the first treatment liquid in the adjusting step. In the adjusting step, the first treatment liquid can be degassed satisfactorily.

It is preferred in the substrate treating method described above that at least one selected from a concentration of the iodide ions (I⁻) in the first treatment liquid, an oxidation-reduction potential in the first treatment liquid, and a concentration of dissolved oxygen in the first treatment liquid is detected in the adjusting step. In the case where the concentration of the iodide ions (I⁻) in the first treatment liquid is detected, the concentration of the iodide ions (I⁻) in the first treatment liquid can be grasped satisfactorily in the adjusting step. In the case where the oxidation-reduction potential in the first treatment liquid is detected, the concentration of the iodide ions (I⁻) in the first treatment liquid can be estimated suitably in the adjusting step. In the case where the concentration of the dissolved oxygen in the first treatment liquid is detected, the concentration of the iodide ions (I⁻) in the first treatment liquid can be estimated suitably in the adjusting step.

It is preferred in the substrate treating method described above that the adjusting step starts and ends in accordance with at least one selected from a detection result of the concentration of the iodide ions (I⁻) in the first treatment liquid, a detection result of the oxidation-reduction potential in the first treatment liquid, and a detection result of the concentration of the dissolved oxygen in the first treatment liquid. The adjusting step can start at a suitable timing. The adjusting step can end at a suitable timing.

It is preferred in the substrate treating method described above that at least either the additive or a solvent of the additive is supplemented to the first treatment liquid in accordance with at least one selected from a detection result of the concentration of the iodide ions (I⁻) in the first treatment liquid, a detection result of the oxidation-reduction potential in the first treatment liquid, and a detection result of the concentration of the dissolved oxygen in the first treatment liquid. The concentration of the iodide ions (I⁻) in the first treatment liquid can be adjusted suitably.

It is preferred in the substrate treating method described above that the substrate has the recesses. Even with the substrate having the recesses, the substrate can be etched suitably regardless of a size of the recesses thereof.

Another aspect of the present invention provides a substrate treating apparatus, the substrate treating apparatus including an adjusting unit configured to remove dissolved oxygen from a first treatment liquid, in which an additive is dissolved and which contains iodide ions ($I^-$), and a supplying unit configured to supply the first treatment liquid, adjusted by the adjusting unit, and a first etchant for etching a substrate to a substrate.

The additive is dissolved in the first treatment liquid. The first treatment liquid contains the additive dissolved in the first treatment liquid. The first treatment liquid contains iodide ions ($I^-$). The substrate treating apparatus includes the adjusting unit and the supplying unit. The adjusting unit removes the dissolved oxygen, contained in the first treatment liquid, from the first treatment liquid. Accordingly, decrease in iodide ions ($I^-$) contained in the first treatment liquid is suppressed. As a result, the first treatment liquid adjusted by the adjusting unit contains a sufficient amount of iodide ions ($I^-$). The supplying unit supplies the first treatment liquid, adjusted by the adjusting unit, and the first etchant to the substrate. The first etchant is used for etching the substrate. Accordingly, the first etchant contains hydrogen ions ($H^+$). As described above, the first treatment liquid adjusted by the adjusting unit contains a sufficient amount of iodide ions ($I^-$). This causes iodide ions ($I^-$) to enter the recesses easily regardless of a size of the recesses on the substrate. This also causes the hydrogen ions ($H^+$) in the first etchant to enter the recesses easily along with the iodide ions ($I^-$) regardless of the size of the recesses. As a result, the substrates can be etched suitably regardless of a size of recesses.

As described above, with the substrate treating apparatus according to the present invention, substrates can be etched suitably regardless of the size of recesses on the substrates.

It is preferred in the substrate treating apparatus described above that, the supplying unit supplies a mixed liquid, generated by adding the first treatment liquid adjusted by the adjusting unit to the first etchant, to the substrate. The supplying unit supplies the mixed liquid. Here, the mixed liquid is generated by adding the first treatment liquid adjusted by the adjusting unit to the first etchant. That is, the mixed liquid contains the first treatment liquid and the first etchant. Accordingly, supplying the mixed liquid corresponds to supplying the first treatment liquid and the first etchant. Moreover, a feature that the mixed liquid contains the first treatment liquid and the first etchant corresponds to a feature that the mixed liquid contains iodide ions ($I^-$) and hydrogen ions ($H^+$). Accordingly, the iodide ions ($I^-$) can satisfactorily promote movement of the hydrogen ions ($H^+$) immediately after the mixed liquid is supplied to the substrate. Consequently, the substrate can be etched more suitably.

It is preferred in the substrate treating apparatus mentioned above that the first treatment liquid is an aqueous solution in which the additive is dissolved in deionized water. Accordingly, the adjusting unit can suppress decrease in iodide ions ($I^-$) contained in the first treatment liquid easily.

Another aspect of the present invention provides a substrate treating apparatus, the substrate treating apparatus including an adjusting unit configured to remove dissolved oxygen from a first treatment liquid, in which an additive is dissolved and which contains iodide ions ($I^-$), and a supplying unit configured to supply the first treatment liquid adjusted by the adjusting unit to the substrate, the first treatment liquid containing a second etchant for etching a substrate.

The additive is dissolved in the first treatment liquid. The first treatment liquid contains the additive dissolved in the first treatment liquid. The first treatment liquid contains iodide ions ($I^-$). The substrate treating apparatus includes the adjusting unit and the supplying unit. The adjusting unit removes the dissolved oxygen, contained in the first treatment liquid, from the first treatment liquid. Accordingly, decrease in iodide ions ($I^-$) contained in the first treatment liquid is suppressed. As a result, the first treatment liquid adjusted by the adjusting unit contains a sufficient amount of iodide ions ($I^-$). Moreover, the first treatment liquid contains the second etchant. The second etchant is used for etching substrates. Accordingly, the second etchant contains hydrogen ions ($H^+$). As a result, the first treatment liquid contains hydrogen ions ($H^+$). In summary, the first treatment liquid adjusted by the adjusting unit contains a sufficient amount of iodide ions ($I^-$). The first treatment liquid also contains hydrogen ions ($H^+$). The supplying unit supplies the first treatment liquid adjusted by the adjusting unit to the substrate. This causes the iodide ions ($I^-$) to enter the recesses easily along with the hydrogen ions ($H^+$) regardless of a size of the recesses on the substrate. This causes the hydrogen ions ($H^+$) to enter the recesses easily along with the iodide ions ($I^-$) immediately after the first treatment liquid is supplied to the substrate. As a result, the substrates can be etched suitably regardless of a size of recesses.

As described above, with the substrate treating apparatus according to the present invention, substrates can be etched suitably regardless of the size of recesses on the substrates.

It is preferred that the substrate treating apparatus described above further includes a first sensor configured to detect a concentration of the iodide ions ($I^-$) in the first treatment liquid, and a controller configured to obtain a detection result of the first sensor. The controller can monitor the concentration of the iodide ions ($I^-$) in the first treatment liquid suitably.

It is preferred in the substrate treating apparatus mentioned above that the controller controls the adjusting unit in accordance with the detection result of the first sensor. The controller can control the adjusting unit suitably.

It is preferred that the substrate treating apparatus mentioned above further includes a first supplementing unit configured to supplement a solvent of the additive to the first treatment liquid, and that the controller causes the first supplementing unit to supplement the solvent to the first treatment liquid in accordance with the detection result of the first sensor. The controller can dilute the first treatment liquid suitably.

It is preferred in the substrate treating apparatus mentioned above that the adjusting unit includes a gas bubble generating unit configured to supply inert gas into the first treatment liquid to generate gas bubbles in the first treatment liquid. The adjusting unit includes the gas bubble generating unit. The gas bubble generating unit supplies inert gas into the first treatment liquid. The gas bubble generating unit generates gas bubbles in the first treatment liquid. Accordingly, the adjusting unit can decrease the concentration of dissolved oxygen in the first treatment liquid satisfactorily.

It is preferred in the substrate treating apparatus mentioned above that the adjusting unit includes a gas-liquid separating unit configured to filter the first treatment liquid to degas the first treatment liquid. The adjusting unit includes the gas-liquid separating unit. The gas-liquid separating unit filters the first treatment liquid. The gas-liquid separating unit degases the first treatment liquid. Accordingly, the adjusting unit can degas the first treatment liquid suitably. Accordingly, the adjusting unit can decrease the concentration of dissolved oxygen in the first treatment liquid satisfactorily.

It is preferred in the substrate treating apparatus described above that the substrate has the recesses. Even with the substrate having the recesses, the substrate can be etched suitably regardless of a size of the recesses thereof.

Advantageous Effects of Invention

With the substrate treating method and the substrate treating apparatus according to the present invention, substrates can be etched suitably regardless of the size of recesses on the substrates.

DESCRIPTION OF EMBODIMENTS

1. Principle of Etching Treatment with Use of Iodide Ions ($I^-$)

The Inventors supposed a mechanism that an etching function varies with use of iodide ions ($I^-$) as under.

Figure 1:
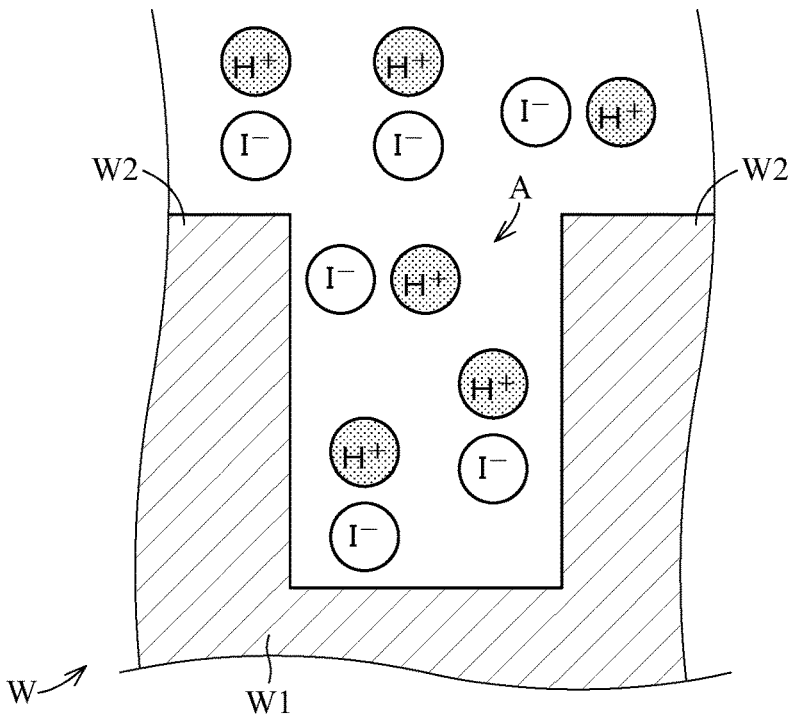
FIG. 1 schematically illustrates operation of etching a substrate.
Figure 2:
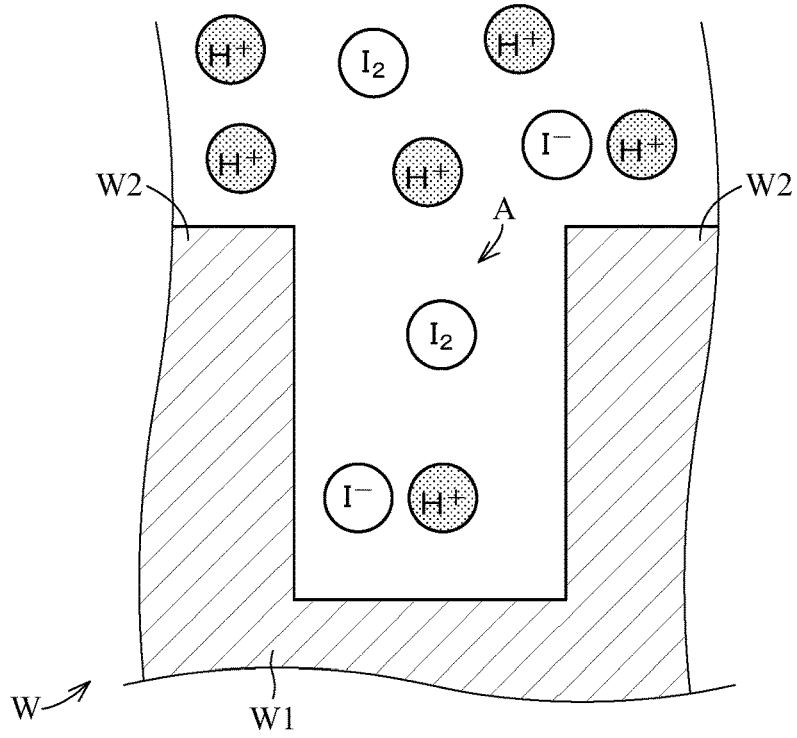
FIG. 2 schematically illustrates operation of etching the substrate.
Figure 3:
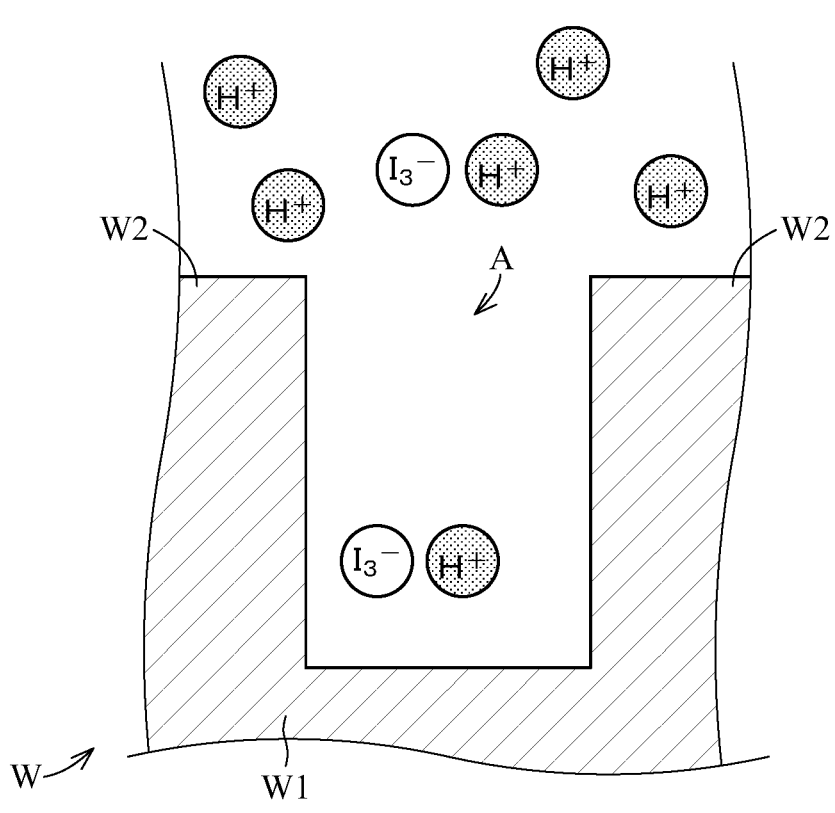
FIG. 3 schematically illustrates operation of etching the substrate.

FIGS. 1, 2, and 3 each schematically illustrate operation of etching a substrate W. FIGS. 1 to 3 each illustrate part of the substrate W. Examples of the substrate W include a semiconductor wafer, a substrate for liquid crystal display, a substrate for organic electroluminescence (EL), a substrate for flat panel display (FPD), a substrate for optical display, a magnetic disk substrate, an optical disk substrate, a magneto-optical disk substrate, a substrate for photomask, and a solar cell substrate. The substrate W has a thin and flat plate shape. The substrate W has a substantially circular shape in plan view.

Reference is made to FIG. 1. The substrate W has a pattern formation face W1. The pattern formation face W1 is formed with a silicon oxide ($SiO_2$) film, a silicon nitride (SiN) film, or a polysilicon film, for example. The pattern formation face W1 includes projections W2 and recesses A. The projections W2 are part of the substrate W. The projections W2 are a structure. The projections W2 are each formed with a silicon oxide ($SiO_2$) film, a silicon nitride (SiN) film, or a polysilicon film. The projections W2 are each formed with a thermal oxide ($SiO_2$) film, for example. The recesses A are a space. The recesses A are adjacent to the projections W2. The projection W2 corresponds to a wall defining the recess A. The projection W2 has hydrophobicity.

A treatment liquid is supplied onto the pattern formation face W1 of the substrate W. The treatment liquid contains an etchant and iodide ions ($I^-$). The etchant is used for etching the substrate W. Since the treatment liquid contains the etchant, the treatment liquid contains hydrogen ions ($H^+$). The hydrogen ion ($H^+$) is one of ions for etching the substrates W. The hydrogen ions ($H^+$) are cations. The iodide ions ($I^-$) are anions. More specifically, the iodide ions ($I^-$) are monovalent monoatomic anions. Iodide ions ($I^-$) have hydrophobicity.

Both the projections W2 and the iodide ions ($I^-$) are hydrophobic. Accordingly, an affinity between the projections W2 and the iodide ions ($I^-$) is better than an affinity between the projections W2 and water molecules. Accordingly, the iodide ions ($I^-$) in the etchant enter the recesses A easily. The iodide ions ($I^-$) enter the recesses A easily without depending on a size of the recesses A. This is because the recesses A are adjacent to the projections W2. Even with narrow recesses A, the iodide ions ($I^-$) enter easily in the recesses A.

The iodide ions ($I^-$) are anions, whereas the hydrogen ions ($H^+$) are cations. Accordingly, the iodide ions ($I^-$) and the hydrogen ions ($H^+$) attract each other. The iodide ions ($I^-$) are movable along with the hydrogen ions ($H^+$). In other words, the iodide ions ($I^-$) can promote movement of the hydrogen ions ($H^+$). Accordingly, the hydrogen ions ($H^+$) also enter the recesses A easily regardless of a size of the recesses A. As a result, the concentration of the hydrogen ions ($H^+$) in the recesses A is not lowered.

The hydrogen ion ($H^+$) is one of ions for etching the substrates. Accordingly, the substrates W can be etched suitably regardless of a size of recesses A.

Reference is made to FIG. 2. The iodide ions ($I^-$) occasionally become an iodine molecule ($I_2$). For example, two iodide ions ($I^-$) become one iodine molecule ($I_2$).

$$2I^- \rightarrow I_2 + 2e^-$$

Accordingly, iodide ions ($I^-$) decrease. Iodine molecules ($I_2$) increase.

The iodine molecules ($I_2$) are electrically neutral. Accordingly, the iodine molecules ($I_2$) and the hydrogen ions ($H^+$) do not attract each other. The iodine molecules ($I_2$) do not move along with the hydrogen ions ($H^+$). In other words, the iodine molecules ($I_2$) do not promote movement of the hydrogen ions ($H^+$). Accordingly, the iodine molecules ($I_2$) enter the recess A not along with hydrogen ions ($H^+$). Even if the iodine molecules ($I_2$) enter the recess A, the hydrogen ions ($H^+$) do not enter the recess A easily. As a result, the concentration of the hydrogen ions ($H^+$) in the recess A is lowered. Therefore, the substrate W cannot be etched suitably. That is, an etching function decreases.

Moreover, the iodine molecules ($I_2$) may occasionally adhere to the substrate W as impurities or dust. In this case, a quality of the etching treatment significantly decreases.

Reference is made to FIG. 3. Iodide ion ($I^-$) occasionally becomes triiodide ions ($I_3^-$). For example, one iodide ion ($I^-$) and one iodine molecule ($I_2$) become one triiodide ion ($I_3^-$).

$$I^- + I_2 \rightarrow I_3^-$$

Accordingly, iodide ions ($I^-$) decrease. The triiodide ions ($I_3^-$) increase.

The triiodide ions ($I_3^-$) are anions. Accordingly, the triiodide ions ($I_3^-$) and the hydrogen ions ($H^+$) attract each other. The triiodide ions ($I_3^-$) are movable along with the hydrogen ions ($H^+$). In other words, the triiodide ions ($I_3^-$) can promote movement of the hydrogen ions ($H^+$). Accordingly, the triiodide ions ($I_3^-$) enter the recess A along with hydrogen ions ($H^+$). However, the triiodide ions ($I_3^-$) are monovalent polyatomic anions composed of three iodine atoms. Accordingly, triiodide ions ($I_3^-$) cannot promote movement of the hydrogen ions ($H^+$) efficiently. For example, three iodide ions ($I^-$) can attract three hydrogen ions ($H^+$), whereas one triiodide ion ($I_3^-$) attracts only one hydrogen ion ($H^+$). As a result, the concentration of the hydrogen ions ($H^+$) in the recess A is lowered. Therefore, the substrate W cannot be etched suitably. That is, an etching function decreases.

As described above, the Inventors found that decrease in etching function is caused by decrease in iodide ions ($I^-$). In other words, the Inventors found that decrease in etching function is caused by composition change of iodide ions ($I^-$). Then, the Inventors made further study about a process and a device for suppressing decrease in iodide ions ($I^-$). The following describes a plurality of embodiments.

2. First Embodiment

<2-1. Outline of Substrate Treating Apparatus>

Figure 4:
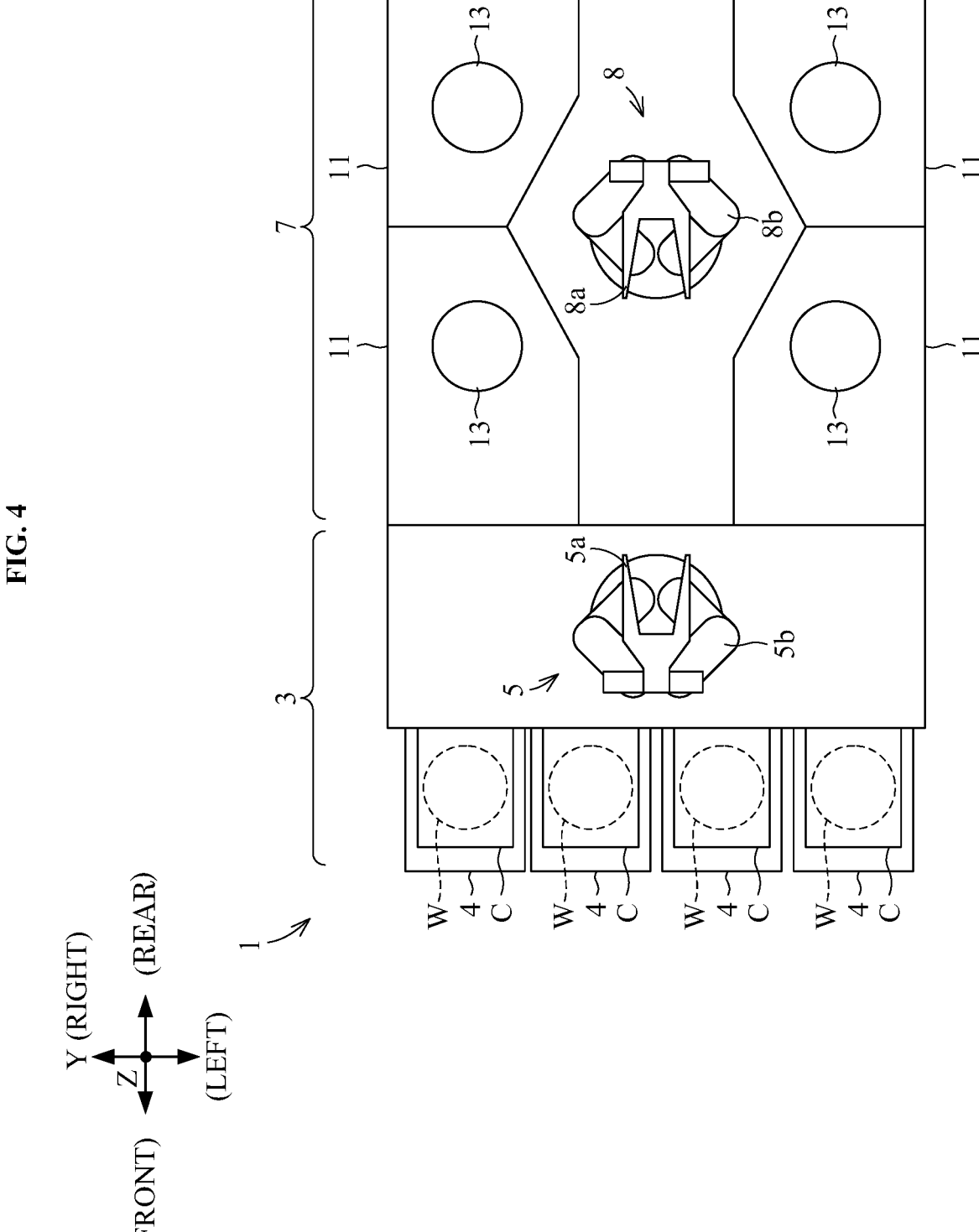
FIG. 4 is a plan view of an interior of a substrate treating apparatus.

FIG. 4 is a plan view of an interior of a substrate treating apparatus 1. The substrate treating apparatus 1 performs treatment on a substrate W. The treatment performed on the substrate W includes etching treatment. The treatment is performed under an environment of room temperature. The room temperature falls within a temperature range of 5 to 35 degrees centigrade, for example.

The substrate treating apparatus 1 includes an indexer 3, and a treating block 7. The treating block 7 is connected to the indexer 3. The indexer 3 supplies a substrate W to the treating block 7. The treating block 7 performs a treatment to the substrate W. The indexer 3 collects the substrate W from the treating block 7.

In this specification, the direction in which the indexer 3 and the treating block 7 are arranged is referred to as a "front-back direction X" for convenience. The front-back direction X is horizontal. One direction of the front-back direction X from the treating block 7 to the indexer 3 is referred to as a "forward direction". The direction opposite to the forward direction is referred to as a "rearward direction". A horizontal direction orthogonal to the front-back direction X is referred to as a "transverse direction Y". Moreover, one direction of the transverse direction Y is referred to as a "rightward direction", as appropriate. The direction opposite to rightward is referred to as "leftward". The perpendicular direction relative to the horizontal direction is referred to as a "vertical direction Z". For reference, the drawings show front, rear, right, left, up, and down, as appropriate.

The indexer 3 includes a plurality of (e.g., four) carrier platforms 4. The carrier platforms 4 each include one carrier C placed thereon. The carrier C accommodates a plurality of substrates W. The carrier C is, for example, a front opening unified pod (FOUP), a standard mechanical interface (SMIF), or an open cassette (OC).

The indexer 3 includes a transport mechanism 5. The transport mechanism 5 is arranged rearward of the carrier platforms 4. The transport mechanism 5 transports substrates W. The transport mechanism 5 is accessible to the carriers C placed on the carrier platforms 4, respectively. The transport mechanism 5 includes a hand 5a and a hand driving unit 5b. The hand 5a supports the substrate W. The hand driving unit 5b is coupled to the hand 5a. The hand driving unit 5b moves the hand 5a. The hand driving unit 5b moves the hand 5a in the front-back direction X, transverse direction Y, and vertical direction Z, for example. The hand driving unit 5b rotates the hand 5a in a horizontal plane, for example.

The treating block 7 includes a transport mechanism 8. The transport mechanism 8 transports substrates W. The substrates W can be delivered between the transport mechanism 5 and the transport mechanism 8. The transport mechanism 8 includes a hand 8a and a hand driving unit 8b. The hand 8a supports the substrate W. The hand driving unit 8b is coupled to the hand 8a. The hand driving unit 8b moves the hand 8a. The hand driving unit 8b moves the hand 8a in the front-back direction X, transverse direction Y, and vertical direction Z, for example. The hand driving unit 8b rotates the hand 8a in a horizontal plane, for example.

The treating block 7 includes a plurality of treating units 11. The treating units 11 are each arranged laterally of the transport mechanism 8. The treating units 11 each perform treatment on a substrate W individually.

The treating unit 11 includes a substrate holder 13. The substrate holder 13 holds a substrate W.

The transport mechanism 8 is accessible to the treating units 11 individually. The transport mechanism 8 can deliver the substrate W on the substrate holder 13. The transport mechanism 8 can take the substrate W from the substrate holder 13.

Figure 5:
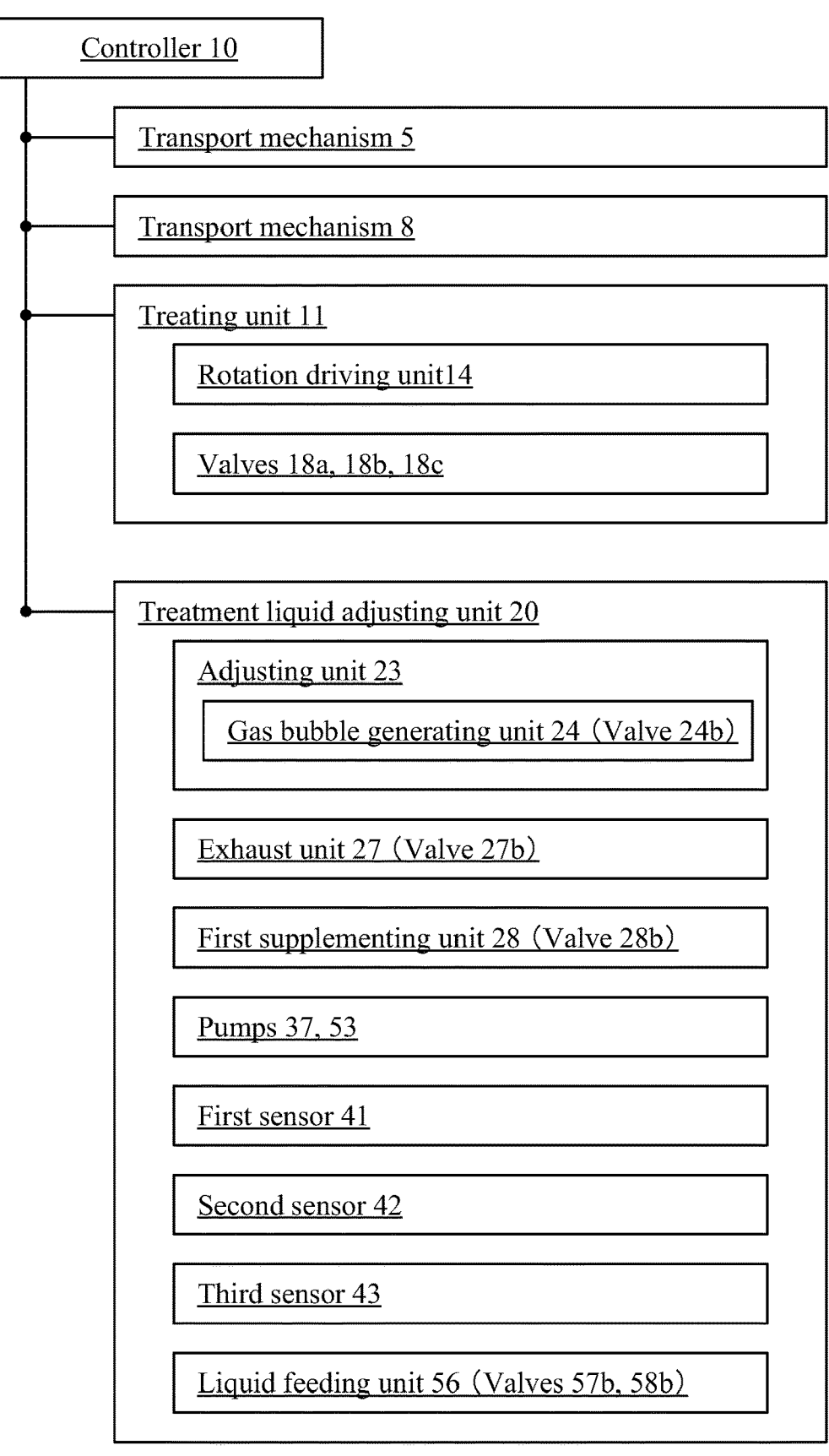
FIG. 5 is a control block diagram of the substrate treating apparatus.

FIG. 5 is a control block diagram of the substrate treating apparatus 1. The substrate treating apparatus 1 includes a controller 10. The controller 10 controls the transport mechanisms 5, 8 and the treating units 11.

The controller 10 is implemented by a central processing unit (CPU) that performs various processes, a random-access memory (RAM) as a workspace of arithmetic processing, and a storage medium such as a fixed disk. The controller 10 contains various types of information stored in a storage medium in advance. The information stored in the controller 10 includes transportation information for controlling the transport mechanisms 5, 8, for example. The information stored in the controller 10 includes processing information for controlling the treating units 11, for example. The processing information is also called processing recipes.

The following simply describes one example of operation of the substrate treating apparatus 1.

The indexer 3 supplies a substrate W to the treating block 7. Specifically, the transport mechanism 5 delivers the substrates W from the carrier C to the transport mechanism 8 of the treating block 7.

The treating block 7 distributes the substrates W from the indexer 3 to the treating unit 11. Specifically, the transport mechanism 8 transports the substrates W from the transport mechanism 5 to the substrate holders 13 of the treating units 11 individually.

The treating unit 11 performs treatment on a substrate W held by the substrate holder 13. The treating unit 11 etches the substrate W, for example.

After the treating unit 11 performs treatment on the substrate W, the treating block 7 returns the substrate W from the treating unit 11 to the indexer 3. Specifically, the transport mechanism 8 transports the substrate W from the substrate holder 13 to the transport mechanism 5.

The indexer 3 collects the substrate W from the treating block 7. Specifically, the transport mechanism 5 transports the substrate W from the transport mechanism 8 to the carrier C.

<2-2. Construction of Treating Unit 11>

Figure 6:
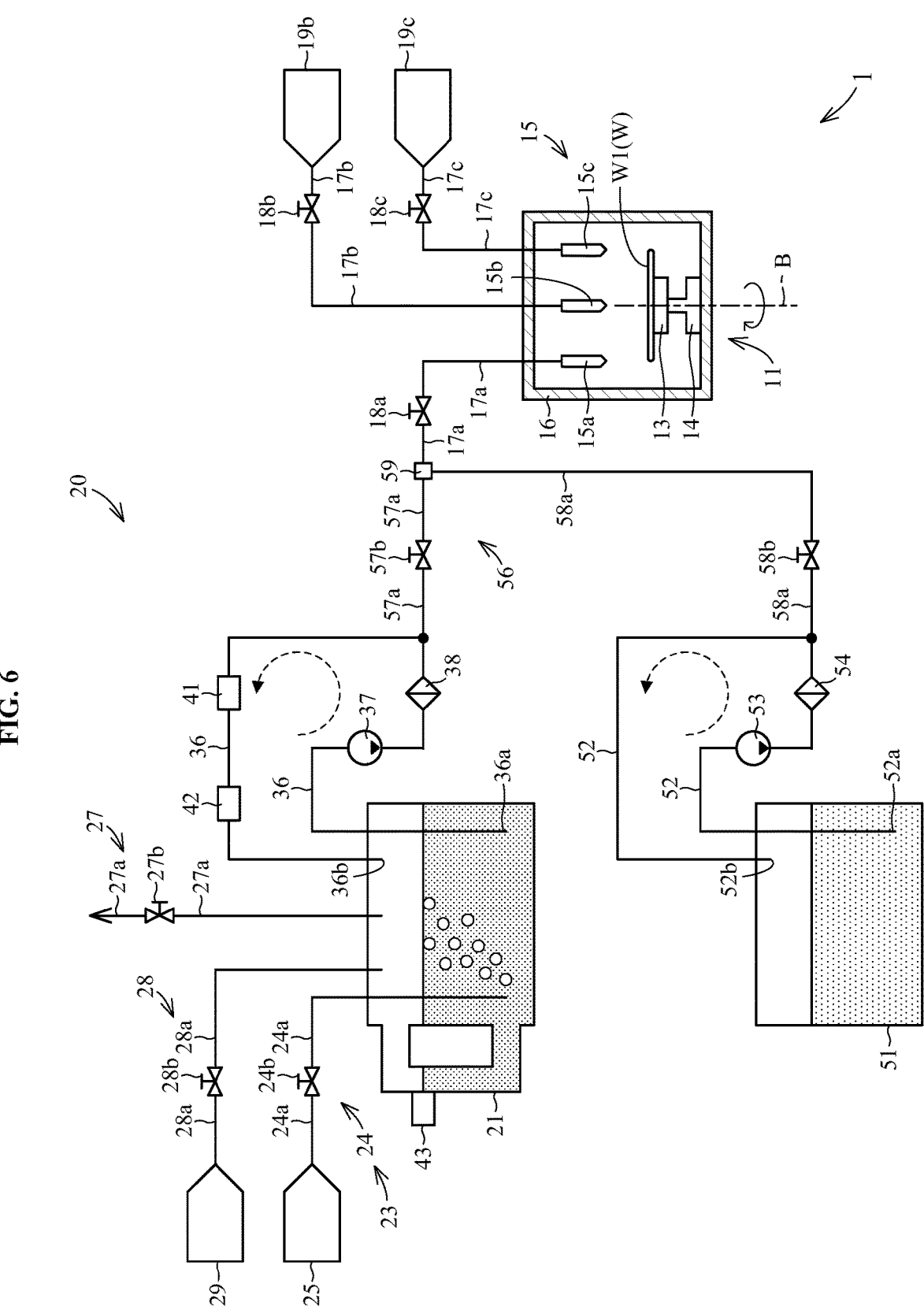
FIG. 6 shows a construction of a treating unit and a treatment liquid adjusting unit according to a first embodiment.

FIG. 6 shows the construction of the treating unit 11. The treating units 11 each have the same construction. The treating unit 11 is classified as a single-wafer processing unit. That is, the treating units 11 each perform treatment on only one substrate W at one time.

The substrate holder 13 holds one substrate W. The substrate holder 13 holds the substrate W in a horizontal posture. The substrate holder 13 holds a peripheral edge or a lower surface of the substrate W. The lower surface of the substrate W is also called a back side of the substrate W. When the substrate W is held by the substrate holder 13, a pattern formation face W1 of the substrate W is directed upward. When the substrate W is held by the substrate holder 13, the pattern formation face W1 of the substrate W is positioned on an upper surface of the substrate W.

The treating units 11 each include a rotation driving unit 14. The rotation driving unit 14 is connected to the substrate holder 13. The rotation driving unit 14 rotates the substrate holder 13. The substrate W held by the substrate holder 13 rotates integrally with the substrate holder 13. The substrate W held by the substrate holder 13 rotates around a rotation axis B. The rotation axis B passes through the center of the substrate W and extends in the vertical direction Z, for example.

The treating units 11 each include a first nozzle 15a, a second nozzle 15b, and a third nozzle 15c. When no distinction is made between the first to third nozzles 15a to 15c hereunder, they are simply referred to as a "nozzle 15". The nozzles 15 each dispense a liquid or gas to the substrate W. The nozzles 15 are each movable between a treating position and a standby position. The treating position is, for example, a position above the substrate W held by the substrate holder 13. The standby position is, for example, a position apart from the above of the substrate W held by the substrate holder 13.

The treating unit 11 includes a casing 16. The casing 16 has a substantial box shape. The casing 16 accommodates therein the substrate holder 13, the rotation driving unit 14, and the nozzle 15.

The treating unit 11 may further include a cup, not shown. The cup is located inside of the casing 16. The cup is arranged around the substrate holder 13. The cup receives liquid scattered from the substrate W held by the substrate holder 13.

The treating unit 11 includes pipes 17a, 17b, and 17c, and vales 18a, 18b, and 18c. The pipes 17a to 17c are connected to the first to third nozzles 15a to 15c, respectively. The valves 18a to 18c are provided on the pipes 17a to 17c, respectively. At least part of the pipe 17a may be provided externally of the casing 16. The same arrangement of the pipe 17a is applicable to arrangement of the pipes 17b and 17c. The valve 18a may be provided externally of the casing 16. The same arrangement of the valve 18a is applicable to arrangement of the valves 18b and 18c.

The substrate treating apparatus 1 includes a treatment liquid adjusting unit 20. The treatment liquid adjusting unit 20 is connected to the pipe 17a. The treatment liquid adjusting unit 20 is in fluid communication with the first nozzle 15a. The treatment liquid adjusting unit 20 is connected to the first nozzle 15a.

The treatment liquid adjusting unit 20 feeds a treatment liquid to the first nozzle 15a. The first nozzle 15a dispenses the treatment liquid. The treatment liquid adjusting unit 20 may feed a treatment liquid to a plurality of treating units 11.

The first nozzle 15a corresponds to one example of the supplying unit in the present invention.

The pipe 17b is connected to a rinse liquid supplying source 19b. The rinse liquid supplying source 19b is connected in fluid communication with the second nozzle 15b. The rinse liquid supplying source 19b feeds a rinse liquid to the second nozzle 15b. The second nozzle 15b dispenses the rinse liquid. Examples of the rinse liquid include deionized water. The deionized water is, for example, water that is deionized (DIW).

The pipe 17c is connected to a gas supplying source 19c. The gas supplying source 19c is connected in fluid communication with the third nozzle 15c. The gas supplying source 19c feeds gas to the third nozzle 15c. The third nozzle 15c ejects gas. The third nozzle 15c blows out gas. The gas is, for example, inert gas. The gas is, for example, nitrogen gas.

The rinse liquid supplying source 19b may be an element of the substrate treating apparatus 1. Alternatively, the rinse liquid supplying source 19b may not be an element of the substrate treating apparatus 1. For example, the rinse liquid supplying source 19b may be a utility setup located externally of the substrate treating apparatus 1. Likewise, the gas supplying source 19c may or may not be an element of the substrate treating apparatus 1.

Reference is made to FIG. 5. The controller 10 controls the rotation driving unit 14, and the valves 18a to 18c.

<2-3. Construction of Treatment Liquid Adjusting Unit 20>

Reference is made to FIG. 6. In the first embodiment, the treatment liquid adjusting unit 20 adjusts the first treatment liquid. The treatment liquid adjusting unit 20 supplies the adjusted first treatment liquid to the first nozzle 15a. Moreover, the treatment liquid adjusting unit 20 supplies a first etchant for etching the substrate W to the first nozzle 15a.

The treatment liquid adjusting unit 20 includes a first tank 21. The first tank 21 stores the first treatment liquid.

The first treatment liquid contains an additive. The additive is dissolved in the first treatment liquid. The first treatment liquid contains iodide ions ($I^-$).

The additive releases the iodide ions ($I^-$) from the additive into the first treatment liquid. Iodide ions ($I^-$) are released from the additive in the first treatment liquid. The additive contains, for example, at least one selected from chemical compounds a1) to a6) cited as under:

a1) tetramethylammonium iodide (TMAI)
a2) tetraethylammonium iodide (TEAI)
a3) tetrapropylammonium iodide (TPAI)
a4) tetrabutylammonium iodide
a5) ammonium iodide
a6) hydrogen iodide The first treatment liquid is an aqueous solution in which the additive is dissolved in deionized water. The deionized water is, for example, water that is deionized (DIW). The deionized water dissolves the additive. The deionized water corresponds to the solvent of the additive. In other words, the first treatment liquid contains the solvent of the additive. The solvent dissolves the additive. The solvent is, for example, deionized water.

The first treatment liquid does not contain an etchant. The first treatment liquid consists of an additive and deionized water only, for example.

The treatment liquid adjusting unit 20 includes an adjusting unit 23. The adjusting unit 23 is in fluid communication with the first tank 21. The adjusting unit 23 is connected to the first tank 21.

The adjusting unit 23 suppresses decrease in iodide ions (I⁻) contained in the first treatment liquid. Specifically, the adjusting unit 23 removes dissolved oxygen, contained in the first treatment liquid, from the first treatment liquid. Accordingly, decrease in iodide ions (I⁻) contained in the first treatment liquid is suppressed.

The adjusting unit 23 includes a gas bubble generating unit 24. The gas bubble generating unit 24 supplies inert gas into the first treatment liquid to generate gas bubbles in the first treatment liquid. That is, the gas bubble generating unit 24 bubbles the first treatment liquid with inert gas. Accordingly, the dissolved oxygen in the first treatment liquid is replaced by the inert gas, and is removed from the first treatment liquid. Specifically, the gas bubble generating unit 24 supplies inert gas into the first treatment liquid in the first tank 21. The inert gas is, for example, nitrogen gas.

The gas bubble generating unit 24 includes a pipe 24a and a valve 24b. The pipe 24a is in fluid communication with the first tank 21. The pipe 24a is connected to the first tank 21. The pipe 24a has a first end arranged in the first treatment liquid of the first tank 21. The first end of the pipe 24a is positioned lower than a liquid level of the first treatment liquid in the first tank 21. The pipe 24a has a second end connected to an inert gas supplying source 25. The valve 24b is provided on the pipe 24a. When the valve 24b opens, the pipe 24a blows inert gas from the first end thereof into the first treatment liquid in the first tank 21.

The treatment liquid adjusting unit 20 includes an exhaust unit 27. The exhaust unit 27 exhausts gas within the first tank 21 to the outside of the first tank 21.

The exhaust unit 27 includes an exhaust pipe 27a and a valve 27b. The exhaust pipe 27a is in fluid communication with the first tank 21. The exhaust pipe 27a is connected to the first tank 21. The exhaust pipe 27a has a first end arranged in an upper portion of the first tank 21. The first end of the exhaust pipe 27a is positioned higher than the liquid level of the first treatment liquid in the first tank 21. The exhaust pipe 27a has a second end opened to the outside of the first tank 21. The valve 27b is provided on the exhaust pipe 27a. When the valve 27b opens, the inside of the first tank 21 is opened to the outside of the first tank 21.

The treatment liquid adjusting unit 20 includes a first supplementing unit 28. The first supplementing unit 28 supplements the solvent of the additive to the first treatment liquid. Specifically, the first supplementing unit 28 supplements the solvent of the additive (i.e., deionized water) to the first tank 21.

The first supplementing unit 28 includes a pipe 28a and a valve 28b. The pipe 28a is in fluid communication with the first tank 21. The pipe 28a is connected to the first tank 21. The pipe 28a is also in fluid communication with a solvent supplying source 29. The pipe 28a is connected to the solvent supplying source 29. The valve 28b is provided on the pipe 28a. When the valve 28b is opened, the pipe 28a supplies the solvent (deionized water) to the first tank 21.

The treatment liquid adjusting unit 20 includes a circulation pipe 36 and a pump 37. The circulation pipe 36 causes the first treatment liquid to circulate. The circulation pipe 36 causes the first treatment liquid to circulate outside of the first tank 21. The circulation pipe 36 has an upstream end

36a and a downstream end 36b. The upstream end 36a and the downstream end 36b are each in fluid communication with the first tank 21. The upstream end 36a and the downstream end 36b are each connected to the first tank 21. The pump 37 is provided on the circulation pipe 36. The pump 37 feeds the first treatment liquid from the upstream end 36a of the circulation pipe 36 to the downstream end 36b of the circulation pipe 36. When the pump 37 operates, the first treatment liquid flows from the first tank 21 to the circulation pipe 36 through the upstream end 36a of the circulation pipe 36. Moreover, the first treatment liquid returns from the circulation pipe 36 to the first tank 21 through the downstream end 36b of the circulation pipe 36.

The treatment liquid adjusting unit 20 includes a filter 38. The filter 38 filters the first treatment liquid. The filter 38 removes foreign substances from the first treatment liquid. The filter 38 is provided in the circulation pipe 36. The filter 38 is located downstream of the pump 37. The filter 38 filters the first treatment liquid flowing in the circulation pipe 36.

The treatment liquid adjusting unit 20 includes a first sensor 41. The first sensor 41 detects a concentration of iodide ions (I⁻) in the first treatment liquid. The first sensor 41 detects a concentration of iodide ions (I⁻) in the first treatment liquid with an absorptiometric method, for example. The first sensor 41 is, for example, an ultraviolet absorption photometric detector or an ultraviolet/visible absorption photometric detector. The first sensor 41 is provided in the circulation pipe 36. The first sensor 41 is located downstream of the filter 38. The first sensor 41 detects a concentration of iodide ions (I⁻) in the first treatment liquid flowing in the circulation pipe 36.

The treatment liquid adjusting unit 20 includes a second sensor 42. The second sensor 42 detects a concentration of dissolved oxygen in the first treatment liquid. The second sensor 42 detects a concentration of dissolved oxygen in the first treatment liquid with an electrochemical analysis (membrane electrode method), for example. The second sensor 42 is provided in the circulation pipe 36. The second sensor 42 is located downstream of the filter 38. The second sensor 42 detects a concentration of dissolved oxygen in the first treatment liquid that flows in the circulation pipe 36.

The treatment liquid adjusting unit 20 includes a third sensor 43. The third sensor 43 detects an amount of the first treatment liquid stored in the first tank 21. The third sensor 43 is, for example, a liquid level sensor. The third sensor 43 detects a height position of a liquid level of the first treatment liquid stored in the first tank 21, for example. The third sensor 43 is attached to the first tank 21.

The treatment liquid adjusting unit 20 includes a second tank 51. The second tank 51 stores a first etchant used for etching the substrate W. The first etchant contains hydrogen ions (H⁺). The first etchant is not adjusted by the adjusting unit 23.

The first etchant includes at least either hydrofluoric acid (HF) or buffered hydrofluoric acid (BHF).

The first etchant may also include an alcohol. The first etchant may contain, for example, at least one selected from alcohols b1) to b7) cited as under:

b1) methyl alcohol b2) ethyl alcohol b3) 2-propanol b4) n-butyl alcohol b5) tert-butyl alcohol b6) cyclohexanol b7) ethylene glycol The first etchant may also contain at least one selected from acids c1) to c7) cited as under:

c1) hydrochloric acid
c2) sulfuric acid
c3) nitric acid
c4) acetic acid
c5) phosphoric acid
c6) hydrogen peroxide
c7) citric acid The treatment liquid adjusting unit 20 includes a circulation pipe 52 and a pump 53. The circulation pipe 52 causes the first etchant to circulate. The circulation pipe 52 causes the first etchant to circulate outside of the second tank 51. The circulation pipe 52 has an upstream end 52a and a downstream end 52b. The upstream end 52a and the downstream end 52b are each in fluid communication with the second tank 51. The upstream end 52a and the downstream end 52b are each connected to the second tank 51. The pump 53 is provided on the circulation pipe 52. The pump 53 feeds the first etchant from the upstream end 52a of the circulation pipe 52 to the downstream end 52b of the circulation pipe 52. When the pump 53 operates, the first etchant flows from the second tank 51 to the circulation pipe 52 through the upstream end 52a of the circulation pipe 52. Moreover, the first etchant returns from the circulation pipe 52 to the second tank 51 through the downstream end 52b of the circulation pipe 52.

The treatment liquid adjusting unit 20 includes a filter 54. The filter 54 filters the first etchant. The filter 54 removes foreign substances from the first etchant. The filter 54 is provided in the circulation pipe 52. The filter 54 is located downstream of a pump 53. The filter 54 filters the first etchant flowing in the circulation pipe 52.

The treatment liquid adjusting unit 20 includes a liquid feeding unit 56. The liquid feeding unit 56 feeds the first treatment liquid and the first etchant to the first nozzle 15a.

The liquid feeding unit 56 includes a pipe 57a and a valve 57b. The pipe 57a diverges from the circulation pipe 36. The pipe 57a is connected to the circulation pipe 36. The pipe 57a and the circulation pipe 36 are connected at a position downstream of the filter 38. The pipe 57a and the circulation pipe 36 are connected at a position upstream of the first sensor 41 and the second sensor 42. The valve 57b is provided on the pipe 57a.

The liquid feeding unit 56 includes a pipe 58a and a valve 58b. The pipe 58a diverges from the circulation pipe 52. The pipe 58a is connected to the circulation pipe 52. The pipe 58a and the circulation pipe 52 are connected at a position downstream of the filter 54. The valve 58b is provided on the pipe 58a.

The liquid feeding unit 56 includes a joint 59. The joint 59 is connected to the pipes 17a, 57a, and 58a. The joint 59 is, for example, a three-way joint. The pipes 17a, 57a, and 58a are in fluid communication with one another through the joint 59.

Reference is made to FIG. 5. The controller 10 controls the treatment liquid adjusting unit 20. The controller 10 is communicably and electrically connected to the treatment liquid adjusting unit 20.

The controller 10 obtains detection results of the first to third sensors 41 to 43.

The controller 10 controls the adjusting unit 23. The controller 23 controls the gas bubble generating unit 24. The controller 23 controls the valve 24b.

The controller 10 controls the exhaust unit 27. The controller 10 controls the valve 27b.

The controller 10 controls the first supplementing unit 28. The controller 10 controls the valve 28b.

The controller 10 controls the pumps 37 and 53.

The controller 10 controls the liquid feeding unit 56. The controller 10 controls the valves 57b and 58b.

The controller 10 contains adjustment information for controlling the treatment liquid adjusting unit 20. The adjustment information is stored in advance in the storage medium of the controller 10.

<2-4. Operation Example of Treatment Liquid Adjusting Unit 20 and Treating Unit 11>

Reference is made to FIG. 6. The following firstly describes an operation example of the treatment liquid adjusting unit 20. The treatment liquid adjusting unit 20 operates in accordance with control by the controller 10.

The treatment liquid adjusting unit 20 executes an adjusting step. In the adjusting step, the valve 24b opens. In the adjusting step, the gas bubble generating unit 24 supplies inert gas into the first treatment liquid to generate gas bubbles in the first treatment liquid. Accordingly, in the adjusting step, dissolved oxygen, contained in the first treatment liquid, is removed from the first treatment liquid. That is, in the adjusting step, the concentration of dissolved oxygen in the first treatment liquid is lowered. As a result, in the adjusting step, decrease in iodide ions ($I^-$) contained in the first treatment liquid is suppressed.

While the adjusting step is executed, the valve 27b is opened. The exhaust unit 27 exhausts gas within the first tank 21 to the outside of the first tank 21. The exhaust unit 27 exhausts oxygen gas, removed from the first treatment liquid, to the outside of the first tank 21.

While the adjusting step is executed, the pump 37 operates. Accordingly, the first treatment liquid circulates in the circulation pipe 36. The filter 38 filters the first treatment liquid. The first sensor 41 detects a concentration of iodide ions ($I^-$) in the first treatment liquid. The second sensor 42 detects a concentration of dissolved oxygen in the first treatment liquid. The third sensor 43 detects an amount of the first treatment liquid stored in the first tank 21. The controller 10 monitors detection results of the first to third sensors 41 to 43.

Here, a period of time where the adjusting step is performed may be irrelevant to the detection result of the first sensor 41 and the detection result of the second sensor 42. For example, the adjusting step may be executed constantly except time when the treatment liquid adjusting unit 20 feeds a treatment liquid to the first nozzle 15a.

Alternatively, the period of time where the adjusting step is performed may depend on at least either the detection result of the first sensor 41 or the detection result of the second sensor 42.

For example, the adjusting step may start in accordance with at least either the detection result of the first sensor 41 or the detection result of the second sensor 42. For example, the adjusting step may start when a concentration of iodide ions ($I^-$) in the first treatment liquid is low. For example, the adjusting step may start when a concentration of dissolved oxygen in the first treatment liquid is high. Here, the controller 10 determines whether or not the concentration of iodide ions ($I^-$) in the first treatment liquid is low. The controller 10 also determines whether or not the concentration of dissolved oxygen in the first treatment liquid is high. Upon such determination, the controller 10 may refer to the adjustment information appropriately. The adjustment information preferably contains a target value, a threshold, or a reference value to be used for such determination as above. The controller 10 determines a timing of starting the adjusting step in accordance with at least either the detection result of the first sensor 41 or the detection result of the second sensor 42.

For example, the adjusting step may end in accordance with at least either the detection result of the first sensor 41 or the detection result of the second sensor 42. For example, the adjusting step may end when a concentration of iodide ions (I⁻) in the first treatment liquid is high. For example, the adjusting step may end when a concentration of dissolved oxygen in the first treatment liquid is low. Here, the controller 10 determines whether or not the concentration of iodide ions (I⁻) in the first treatment liquid is high. The controller 10 also determines whether or not the concentration of dissolved oxygen in the first treatment liquid is low. The controller 10 determines a timing of ending the adjusting step in accordance with at least either the detection result of the first sensor 41 or the detection result of the second sensor 42.

The pump 37 preferably operates even when the adjusting step is not executed.

The first supplementing unit 28 supplements a solvent (deionized water) to the first tank 21 in response to control by the controller 10.

For example, the first supplementing unit 28 may supplement the solvent (deionized water) to the first tank 21 in response to a detection result of the first sensor 41. Specifically, the first supplementing unit 28 may supplement the solvent (deionized water) to the first tank 21 when a concentration of iodide ions (I⁻) in the first treatment liquid is excessively high. Here, the controller 10 determines whether or not the concentration of iodide ions (I⁻) in the first treatment liquid is excessively high. The controller 10 controls the first supplementing unit 28 in accordance with the first sensor 41.

For example, the first supplementing unit 28 may supplement the solvent (deionized water) to the first tank 21 in response to a detection result of the third sensor 43. Specifically, the first supplementing unit 28 may supplement the solvent (deionized water) to the first tank 21 when an amount of the first treatment liquid in the first tank 21 is small. The controller 10 also determines whether or not the amount of the first treatment liquid in the first tank 21 is small. The controller 10 controls the first supplementing unit 28 in accordance with the third sensor 43.

When the first supplementing unit 28 supplements the solvent (deionized water) to the first tank 21, the adjusting step may be executed or the adjusting step may not be executed. When the first supplementing unit 28 supplements the solvent (deionized water) to the first tank 21, the exhaust unit 27 preferably open inside of the first tank 21 toward outside of the first tank 21. The pump 37 preferably operates even when the first supplementing unit 28 supplements the solvent (deionized water) to the first tank 21.

It is preferred that the liquid feeding unit 56 does not feed the first treatment liquid to the first pipe 17a during execution of the adjusting step. It is preferred that the valve 57b is closed when the valve 24b is opened.

As described above, the first treatment liquid is adjusted in the adjusting step (by adjusting unit 23). The first treatment liquid, adjusted in the adjusting step (by adjusting unit 23), contains a sufficient amount of iodide ions (I⁻).

While, the pump 53 operates in the second tank 51. Accordingly, the first etchant circulates in the circulation pipe 52. The filter 54 filters the first etchant.

The liquid feeding unit 56 supplies the first treatment liquid, adjusted in the adjusting step (by adjusting unit 23) to the first nozzle 15a together with the first etchant. Specifically, the valves 57b and 58b open while the pumps 37 and 53 operate. The first treatment liquid flows from the circulation pipe 36 to the pipe 57a. The first etchant flows from the circulation pipe 52 to the pipe 58a. The first treatment liquid and the first etchant meet at the joint 59. The first treatment liquid is added to the first etchant. A mixed liquid is generated at the joint 59. The mixed liquid contains the first treatment liquid adjusted in the adjusting step and also contains the first etchant. The mixed liquid is obtained by adding the first treatment liquid adjusted in the adjusting step to the first etchant. The mixed liquid of the first treatment liquid and the first etchant flows from the joint 59 to the pipe 17a.

It is preferred that the adjusting step is not executed when the liquid feeding unit 56 feeds the first treatment liquid to the first pipe 17a. Specifically, it is preferred that the gas bubble generating unit 24 generates no gas bubbles in the first treatment liquid when the liquid feeding unit 56 feeds the first treatment liquid to the first pipe 17a. It is preferred that the valve 57b opens after the valve 24b closes.

The supplying step is executed when the valve 18a opens. In the supplying step, the first nozzle 15a dispenses the first treatment liquid and the first etchant to a substrate W. The first nozzle 15a supplies the mixed liquid of the first treatment liquid and the first etchant to the substrate W.

The following briefly describes one example of operation of the treating unit 11. The treating unit 11 operates in accordance with control by the controller 10.

The substrate holder 13 holds a substrate W. The rotation driving unit 14 rotates the substrate W held by the substrate holder 13.

The substrate W is to be cleaned. The valve 18b opens. The second nozzle 15b dispenses a rinse liquid to the substrate W held by the substrate holder 13. The rinse liquid is supplied onto the pattern formation face W1. The substrate W is cleaned with the rinse liquid. Then, the valve 18b closes. The second nozzle 15b stops dispensing the rinse liquid.

The substrate W is to be etched. The supplying step starts. Specifically, the valve 18a opens. The first nozzle 15a dispenses the first treatment liquid, adjusted in the adjusting step, and the first etchant to the substrate W. Specifically, the first nozzle 15a dispenses the mixed liquid, obtained by adding the first treatment liquid adjusted in the adjusting step to the first etchant, to the substrate W held by the substrate holder 13. The mixed liquid is supplied onto the pattern formation face W1. The substrate W is etched with the mixed liquid.

Then, the supplying step is completed. Specifically, the valve 18a closes. The first nozzle 15a stops dispensing the mixed liquid.

The substrate W is to be cleaned. The valve 18b opens. The second nozzle 15b dispenses a rinse liquid to the substrate W held by the substrate holder 13. The rinse liquid is supplied onto the pattern formation face W1. The substrate W is cleaned with the rinse liquid. Then, the valve 18b closes. The second nozzle 15b stops dispensing the rinse liquid.

The substrate W is to be dried. The valve 18c opens. The third nozzle 15c dispenses gas to the substrate W held by the substrate holder 13. The gas is supplied onto the pattern formation face W1. The substrate W is dried. Then, the valve 18c closes. The third nozzle 15c stops dispensing gas.

The rotation driving unit 14 stop rotating the substrate W. The substrate W rests. The treating unit 11 completes treatment on the substrate W.

<2-5. Effect of First Embodiment>

The additive is dissolved in the first treatment liquid. The first treatment liquid contains the additive dissolved in the first treatment liquid. The first treatment liquid contains iodide ions ($I^-$). The substrate treating method in the first embodiment includes the adjusting step and the supplying step. In the adjusting step, decrease in iodide ions ($I^-$) contained in the first treatment liquid is suppressed. For example, the adjusting step suppresses change of iodide ions ($I^-$) into iodine molecules ($I_2$). For example, the adjusting step suppresses change of iodide ions ($I^-$) into triiodide ions ($I_3$). Accordingly, the first treatment liquid contains a sufficient amount of iodide ions ($I^-$). In the supplying step, the first treatment liquid adjusted in the adjusting step is supplied to the substrate W. Moreover, the first etchant is supplied to the substrate W in the supplying step. As described above, the first treatment liquid adjusted in the adjusting step contains a sufficient amount of iodide ions ($I^-$). This causes iodide ions ($I^-$) to enter the recesses A easily regardless of a size of the recesses A on the substrate W. This also causes hydrogen ions ($H^+$) in the first etchant to enter the recesses A easily along with the iodide ions ($I^-$) regardless of the size of the recesses A. As a result, the substrates W can be etched suitably regardless of a size of recesses A on the substrates W.

As described above, with the substrate treating method, the substrates W can be etched suitably regardless of the size of recesses A on the substrates W.

In the supplying step, the mixed liquid is supplied to the substrate W. Here, the mixed liquid is generated by adding the first treatment liquid adjusted in the adjusting step to the first etchant. That is, the mixed liquid contains the first treatment liquid and the first etchant. Accordingly, supplying the mixed liquid corresponds to supplying the first treatment liquid and the first etchant. Moreover, a feature that the mixed liquid contains the first treatment liquid and the first etchant corresponds to a feature that the mixed liquid contains iodide ions ($I^-$) and hydrogen ions ($H^+$). Accordingly, the iodide ions ($I^-$) can satisfactorily promote movement of the hydrogen ions ($H^+$) immediately after the mixed liquid is supplied to the substrate W. Consequently, the substrate W can be etched more suitably.

The first treatment liquid is an aqueous solution in which the additive is dissolved in deionized water. The first treatment liquid contains deionized water and the additive dissolved in the deionized water. Accordingly, in the adjusting step, decrease in iodide ions ($I^-$) contained in the first treatment liquid can be suppressed easily.

The first treatment liquid consists of the additive and the deionized water only. Accordingly, in the adjusting step, decrease in iodide ions ($I^-$) contained in the first treatment liquid can be suppressed easily.

The first treatment liquid does not contain an etchant. Accordingly, in the adjusting step, decrease in iodide ions ($I^-$) contained in the first treatment liquid can be suppressed easily.

The additive releases the iodide ions ($I^-$) from the additive into the first treatment liquid. Iodide ions ($I^-$) are released from the additive in the first treatment liquid. Accordingly, the first treatment liquid can contain iodide ions ($I^-$) satisfactorily.

The additive contains at least one selected from the chemical compounds a1) to a6) described above. Accordingly, the first treatment liquid can contain iodide ions ($I^-$) satisfactorily.

In the adjusting step, the concentration of dissolved oxygen in the first treatment liquid is lowered satisfactorily. Accordingly, in the adjusting step, decrease in iodide ions ($I^-$) contained in the first treatment liquid can be suppressed.

In the adjusting step, inert gas is supplied into the first treatment liquid to generate gas bubbles in the first treatment liquid. Accordingly, in the adjusting step, the concentration of dissolved oxygen in the first treatment liquid can be lowered satisfactorily.

In the adjusting step, the concentration of iodide ions ($I^-$) in the first treatment liquid is detected. Accordingly, in the adjusting step, the concentration of iodide ions ($I^-$) in the first treatment liquid can be grasped satisfactorily.

In the adjusting step, the concentration of dissolved oxygen in the first treatment liquid is detected. Accordingly, in the adjusting step, the concentration of iodide ions ($I^-$) in the first treatment liquid can be estimated suitably. This is because the Inventors found that a constant relationship is present between dissolved oxygen in the first treatment liquid and composition change of iodide ions ($I^-$). For example, composition change of iodide ions ($I^-$) to iodine molecules ($I_2$) or the triiodide ions ($I^-$) is difficult as the concentration of dissolved oxygen in the first treatment liquid is low. Accordingly, when the concentration of dissolved oxygen in the first treatment liquid is low, it is estimated that a concentration of iodide ions ($I^-$) in the first treatment liquid is high.

The adjusting step starts in accordance with at least either a detection result of a concentration of iodide ions ($I^-$) in the first treatment liquid or a detection result of a concentration of dissolved oxygen in the first treatment liquid. Accordingly, the adjusting step can start at a suitable timing.

The adjusting step ends in accordance with at least either a detection result of a concentration of iodide ions ($I^-$) in the first treatment liquid or a detection result of a concentration of dissolved oxygen in the first treatment liquid. Accordingly, the adjusting step can end at a suitable timing.

The solvent of the additive (i.e., deionized water) is supplemented to the first treatment liquid in accordance with a detection result of a concentration of iodide ions ($I^-$) in the first treatment liquid. Accordingly, the first treatment liquid can be diluted suitably. As a result, iodide ions ($I^-$) in the first treatment liquid can be adjusted suitably.

The first etchant contains hydrogen ions ($H^+$). Accordingly, the substrates W can be etched suitably.

The first etchant includes at least either hydrofluoric acid (HF) or buffered hydrofluoric acid (BHF). Accordingly, the substrates W can be etched suitably.

The first etchant contains alcohol. Accordingly, the substrates W can be etched more suitably.

The first etchant contains at least one selected from the alcohols b1) to b7) described above. Accordingly, the substrates W can be etched more suitably.

The first etchant contains at least one selected from the acids c1) to c7) described above. Accordingly, the substrates W can be etched more suitably.

The substrate W has recesses A. Even with the substrate W having the recesses A, the substrate W can be etched suitably regardless of a size of the recesses A on the substrate W.

The substrate treating apparatus 1 includes the adjusting unit 23. The adjusting unit 23 removes dissolved oxygen in the first treatment liquid from the first treatment liquid. Accordingly, decrease in iodide ions ($I^-$) contained in the first treatment liquid is suppressed. As a result, the first treatment liquid adjusted by the adjusting unit 23 contains a sufficient amount of iodide ions ($I^-$). The substrate treating apparatus 1 includes the first nozzle 15a. The first nozzle 15a supplies the first treatment liquid adjusted by the adjusting unit 23 to the substrate W. Moreover, the first nozzle 15a supplies the first etchant to the substrate W. As described above, the first treatment liquid adjusted by the adjusting unit 23 contains a sufficient amount of iodide ions ($I^-$). This causes iodide ions (I⁻) to enter the recesses A easily regardless of a size of the recesses A on the substrate W. This also causes hydrogen ions (H⁺) in the first etchant to enter the recesses A easily along with the iodide ions (I⁻) regardless of the size of the recesses A. As a result, the substrates W can be etched suitably regardless of a size of recesses A.

As described above, with the substrate treating apparatus 1, the substrates W can be etched suitably regardless of the size of recesses A on the substrates W.

The first nozzle 15a supplies the mixed liquid. Here, the mixed liquid is generated by adding the first treatment liquid adjusted by the adjusting unit 23 to the first etchant. That is, the mixed liquid contains the first treatment liquid and the first etchant. Accordingly, supplying the mixed liquid corresponds to supplying the first treatment liquid and the first etchant. Moreover, a feature that the mixed liquid contains the first treatment liquid and the first etchant corresponds to a feature that the mixed liquid contains iodide ions (I⁻) and hydrogen ions (H⁺). Accordingly, the iodide ions (I⁻) can satisfactorily promote movement of the hydrogen ions (H⁺) immediately after the mixed liquid is supplied to the substrate W. Consequently, the substrate W can be etched more suitably.

The first treatment liquid is an aqueous solution in which the additive is dissolved in deionized water. The first treatment liquid contains deionized water and the additive dissolved in the deionized water. Accordingly, the adjusting unit 23 can suppress decrease in iodide ions (I⁻) contained in the first treatment liquid easily.

The first treatment liquid consists of the additive and the deionized water only. Accordingly, the adjusting unit 23 can suppress decrease in iodide ions (I⁻) contained in the first treatment liquid easily.

The first treatment liquid does not contain an etchant. Accordingly, the adjusting unit 23 can suppress decrease in iodide ions (I⁻) contained in the first treatment liquid easily.

The substrate treating apparatus 1 includes the first sensor 41 and the controller 10. The first sensor 41 detects a concentration of iodide ions (I⁻) in the first treatment liquid. The controller 10 obtains detection results of the first sensor 41. Accordingly, the controller 10 can monitor a concentration of iodide ions (I⁻) in the first treatment liquid suitably.

The controller 10 controls the adjusting unit 23 in accordance with the detection results of the first sensor 41. Accordingly, the controller 10 can control the adjusting unit 23 suitably.

The substrate treating apparatus 1 includes the first supplementing unit 28. The first supplementing unit 28 supplements the solvent of the additive (i.e., deionized water) to the first treatment liquid. The controller 10 causes the first supplementing unit 28 to supplement the solvent of the additive (i.e., deionized water) to the first treatment liquid in response to the detection results of the first sensor 41. Accordingly, the controller 10 can dilute the first treatment liquid suitably.

The substrate treating apparatus 1 includes the second sensor 42. The second sensor 42 detects a concentration of dissolved oxygen in the first treatment liquid. The controller 10 obtains detection results of the second sensor 42. Accordingly, the controller 10 can monitor the concentration of dissolved oxygen in the first treatment liquid suitably.

The controller 10 controls the adjusting unit 23 in accordance with the detection results of the second sensor 42. Accordingly, the controller 10 can control the adjusting unit 23 suitably.

The substrate treating apparatus 1 includes the third sensor 43. The third sensor 43 detects an amount of the first treatment liquid stored in the first tank 21. The controller 10 obtains detection results of the second sensor 42. Accordingly, the controller 10 can monitor the amount of the first treatment liquid stored in the first tank 21 suitably.

The controller 10 controls the first supplementing unit 28 in accordance with the detection results of the third sensor 43. Accordingly, the controller 10 can keep the amount of the first treatment liquid stored in the first tank 21 suitably. For example, there is sometimes a case where the first treatment liquid (e.g., deionized water) evaporates and the amount of the first treatment liquid stored in the first tank 21 is reduced when the adjusting unit 23 removes dissolved oxygen in the first treatment liquid from the first treatment liquid. Even in such a case as above, the controller 10 can keep the amount of the first treatment liquid stored in the first tank 21 suitably.

The adjusting unit 23 includes the gas bubble generating unit 24. The gas bubble generating unit 24 supplies inert gas into the first treatment liquid to generate gas bubbles in the first treatment liquid. Accordingly, the adjusting unit 23 can decrease the concentration of dissolved oxygen in the first treatment liquid satisfactorily.

The adjusting unit 23 includes the gas bubble generating unit 24. Accordingly, the adjusting unit 23 can be realized cheaply.

The substrate treating apparatus 1 includes the exhaust unit 27. The exhaust unit 27 exhausts oxygen gas, removed from the first treatment liquid, to the outside of the first tank 21. Accordingly, the adjusting unit 23 can decrease the concentration of dissolved oxygen in the first treatment liquid effectively.

The substrate treating apparatus 1 includes the joint 59. The joint 59 causes the first treatment liquid adjusted by the adjusting unit 23 to be added to the first etchant. The joint 59 generates the mixed liquid. The joint 59 is in fluid communication with the first nozzle 15a. Accordingly, the mixed liquid of the first treatment liquid and the first etchant can be fed to the first nozzle 15a.

The substrate W has recesses A. Even with the substrate W having the recesses A, the substrate W can be etched suitably regardless of a size of the recesses A on the substrate W.

3. Second Embodiment

The following describes a substrate treating apparatus 1 according to a second embodiment with reference to the drawings. Like numerals are used to identify like components which are the same as those in the first embodiment, and the components will not particularly be described.

The second embodiment has an outline of a substrate treating apparatus 1 and a construction of treating units 11 substantially same as those in the first embodiment. The following describes a construction of a treatment liquid adjusting unit 20 according to the second embodiment.

<3-1. Construction of Treatment Liquid Adjusting Unit 20>

Figure 7:
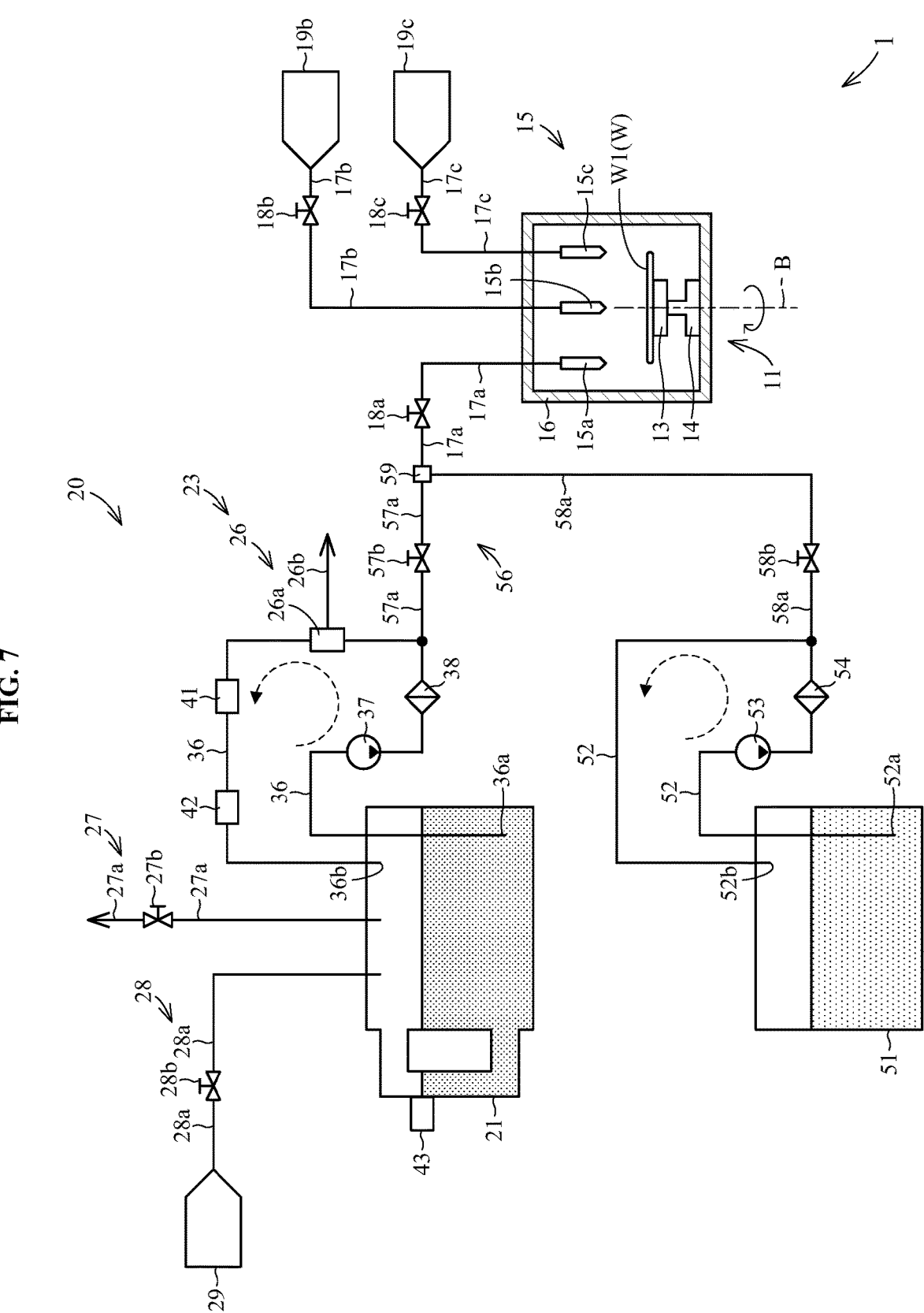
FIG. 7 shows a construction of a treating unit and a treatment liquid adjusting unit according to a second embodiment.

FIG. 7 shows the construction of the treating unit 11 and the treatment liquid adjusting unit 20 according to the second embodiment. In the second embodiment, the treatment liquid adjusting unit 20 adjusts a first treatment liquid. The treatment liquid adjusting unit 20 supplies the adjusted first treatment liquid to the first nozzle 15a. Moreover, the treatment liquid adjusting unit 20 supplies a first etchant to the first nozzle 15a. The treatment liquid adjusting unit 20 of the second embodiment differs from the treatment liquid adjusting unit 20 of the first embodiment in construction of the adjusting unit 23.

The first tank 21 stores the first treatment liquid.

The first treatment liquid in the second embodiment is substantially same as the first treatment liquid in the first embodiment. The first treatment liquid in the second embodiment has substantially the same composition as that of the first treatment liquid in the first embodiment. That is, the first treatment liquid contains an additive. The additive is dissolved in the first treatment liquid. The first treatment liquid contains iodide ions ($I^-$). The first treatment liquid contains a solvent of the additive. The solvent is deionized water. The first treatment liquid is an aqueous solution in which the additive is dissolved in deionized water. The first treatment liquid does not contain an etchant. The first treatment liquid consists of an additive and deionized water only, for example.

The adjusting unit 23 suppresses decrease in iodide ions ($I^-$) contained in the first treatment liquid. Specifically, the adjusting unit 23 degases the first treatment liquid. In other words, the adjusting unit 23 removes dissolved gas in the first treatment liquid from the first treatment liquid. Accordingly, decrease in iodide ions ($I^-$) contained in the first treatment liquid is suppressed.

The adjusting unit 23 includes the gas-liquid separating unit 26. The gas-liquid separating unit 26 filters the first treatment liquid to degas the first treatment liquid. The gas-liquid separating unit 26 is provided in the circulation pipe 36. The gas-liquid separating unit 26 degases the first treatment liquid flowing in the circulation pipe 36.

The gas-liquid separating unit 26 includes a degassing filter 26a and an exhaust pipe 26b. The degassing filter 26a includes a hollow fiber membrane, not shown, for example. The degassing filter 26a is in fluid communication with the circulation pipe 36. The degassing filter 26a is connected to the circulation pipe 36. The exhaust pipe 26b is in fluid communication with the degassing filter 26a. The exhaust pipe 26b is connected to the degassing filter 26a. The exhaust pipe 26b exhausts gas, removed from the first treatment liquid, to the outside of the degassing filter 26a.

<3-2. Operation Example of Treatment Liquid Adjusting Unit 20>

The treatment liquid adjusting unit 20 operates in accordance with control by the controller 10.

The treatment liquid adjusting unit 20 executes an adjusting step. In the adjusting step, the pump 37 operates. Accordingly, the first treatment liquid circulates in the circulation pipe 36. The gas-liquid separating unit 26 degases the first treatment liquid flowing in the circulation pipe 36. The degassed first treatment liquid returns back to the first tank 21.

As described above, the first treatment liquid is adjusted in the adjusting step (by adjusting unit 23). The first treatment liquid, adjusted in the adjusting step (by adjusting unit 23), contains a sufficient amount of iodide ions ($I^-$).

The liquid feeding unit 56 supplies the first treatment liquid, adjusted in the adjusting step (by adjusting unit 23) to the first nozzle 15a together with the first etchant. Specifically, the valves 57b and 58b open while the pumps 37 and 53 operate. Accordingly, the adjusting step is executed even when the liquid feeding unit 56 feeds the first treatment liquid to the first nozzle 15a. Specifically, the gas-liquid separating unit 26 degases the first treatment liquid flowing in the circulation pipe 36 even when the liquid feeding unit 56 feeds the first treatment liquid to the first nozzle 15a.

<3-3. Effect of Second Embodiment>

The second embodiment produces a similar effect to that of the first embodiment. For example, decrease in iodide ions ($I^-$) contained in the first treatment liquid can be suppressed satisfactorily even with the substrate treating method and the substrate treating apparatus 1 according to the second embodiment. As a result, the substrates W can be etched suitably regardless of a size of recesses A on the substrate W.

Moreover, in the adjusting step of the substrate treating method according to the second embodiment, the first treatment liquid is degassed. Accordingly, in the adjusting step, decrease in iodide ions ($I^-$) contained in the first treatment liquid can be suppressed satisfactorily.

In the adjusting step, the gas-liquid separating unit 26 filters the first treatment liquid to degas the first treatment liquid. Accordingly, in the adjusting step, the first treatment liquid can be degassed satisfactorily.

The adjusting unit 23 of the second embodiment includes the gas-liquid separating unit 26. Accordingly, the adjusting unit 23 can degas the first treatment liquid suitably. Accordingly, the adjusting unit 23 can decrease the concentration of dissolved oxygen in the first treatment liquid satisfactorily.

Moreover, the gas-liquid separating unit 26 can degas the first treatment liquid without evaporation of the first treatment liquid (e.g., deionized water). Accordingly, the adjusting unit 23 can decrease the concentration of dissolved oxygen in the first treatment liquid satisfactorily while decrease of the first treatment liquid stored in the first tank 21 is suppressed.

4. Third Embodiment

The following describes a substrate treating apparatus 1 according to a third embodiment with reference to the drawings. Like numerals are used to identify like components which are the same as those in the first embodiment, and the components will not particularly be described.

The third embodiment has an outline of a substrate treating apparatus 1 and a construction of treating units 11 substantially same as those in the first embodiment. The following describes a construction of a treatment liquid adjusting unit 20 according to the third embodiment.

<4-1. Construction of Treatment Liquid Adjusting Unit 20>

Figure 8:
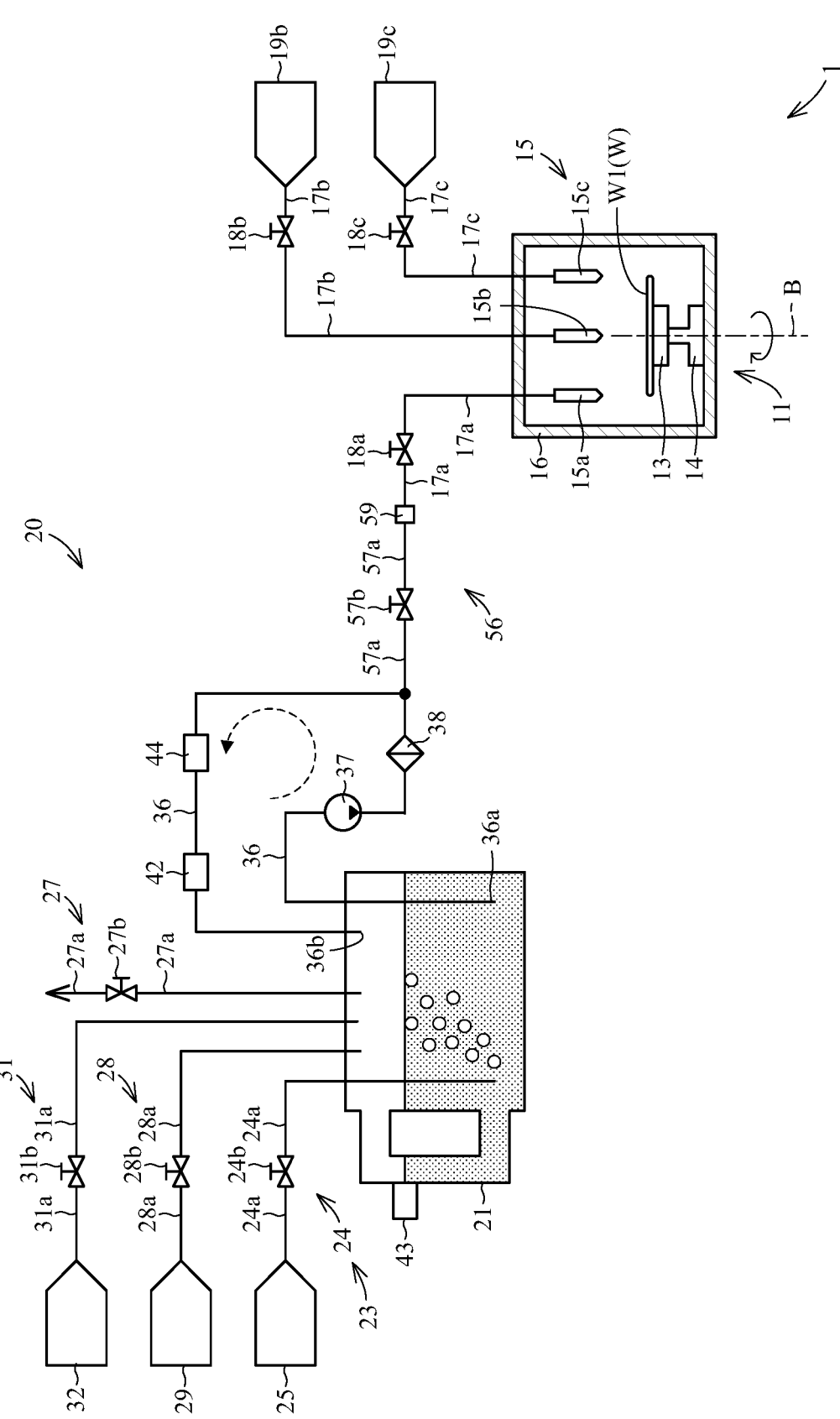
FIG. 8 shows a construction of a treating unit and a treatment liquid adjusting unit according to a third embodiment.

FIG. 8 shows the construction of a treating unit 11 and a treatment liquid adjusting unit 20 according to the third embodiment. In the third embodiment, the treatment liquid adjusting unit 20 adjusts a first treatment liquid. The treatment liquid adjusting unit 20 supplies the adjusted first treatment liquid to the first nozzle 15a. The first treatment liquid in the third embodiment is partially different from the first treatment liquid in the first embodiment.

The first tank 21 stores the first treatment liquid.

The first treatment liquid contains an additive. The additive is dissolved in the first treatment liquid. The first treatment liquid contains iodide ions ($I^-$). The first treatment liquid contains a solvent of the additive. The solvent is deionized water. The first treatment liquid further contains a second etchant for etching the substrate W. Accordingly, the second etchant is adjusted by the adjusting unit 23. The second etchant contains hydrogen ions ($H^+$).

The second etchant includes at least either hydrofluoric acid (HF) or buffered hydrofluoric acid (BHF).

The first treatment liquid may also include an alcohol. The first treatment liquid may contain, for example, at least one selected from the alcohols b1) to b7) described above. The first treatment liquid may also contain at least one selected from the acids c1) to c7) described above.

The treatment liquid adjusting unit 20 includes a second supplementing unit 31. The second supplementing unit 31 supplements the second etchant to the first treatment liquid. Specifically, the second supplementing unit 31 supplements the second etchant to the first tank 21.

The second supplementing unit 31 includes a pipe 31*a* and a valve 31*b*. The pipe 31*a* is in fluid communication with the first tank 21. The pipe 31*a* is connected to the first tank 21. The pipe 31*a* is also in fluid communication with an etchant supplying source 32. The pipe 31*a* is connected to the etchant supplying source 32. The valve 31*b* is provided on the pipe 31*a*. When the valve 31*b* is opened, the pipe 31*a* supplies the second etchant to the first tank 21.

The treatment liquid adjusting unit 20 includes a fourth sensor 44. The fourth sensor 44 detects a concentration of hydrogen ions in the first treatment liquid, for example. The fourth sensor 44 detects a pH value of the first treatment liquid, for example. The fourth sensor 44 is, for example, a pH meter.

The controller 10 obtains detection results of the fourth sensor 44, which illustration is omitted. The controller 10 controls the second supplementing unit 31. The controller 10 controls the valve 31*b*.

<4-2. Operation Example of Treatment Liquid Adjusting Unit 20>

The treatment liquid adjusting unit 20 operates in accordance with control by the controller 10.

The treatment liquid adjusting unit 20 executes an adjusting step. In the adjusting step, the valve 24*b* opens. In the adjusting step, the gas bubble generating unit 24 supplies inert gas into the first treatment liquid to generate gas bubbles in the first treatment liquid. As a result, in the adjusting step, decrease in iodide ions (I$^-$) contained in the first treatment liquid is suppressed.

While the adjusting step is executed, the pump 37 operates. Accordingly, the first treatment liquid circulates in the circulation pipe 36. The second sensor 42 detects a concentration of dissolved oxygen in the first treatment liquid. The fourth sensor 44 detects a concentration of hydrogen ions in the first treatment liquid. The controller 10 monitors detection results of the second sensor 42 and detection results of the fourth sensor 44.

The first supplementing unit 28 and the second supplementing unit 31 supplement the solvent (deionized water) and the second etchant, respectively, to the first tank 21 in response to control by the controller 10.

For example, the first supplementing unit 28 may supplement the solvent (deionized water) to the first tank 21 in accordance with the detection results of the fourth sensor 44. Specifically, the first supplementing unit 28 may supplement the solvent (deionized water) to the first tank 21 when a concentration of hydrogen ions in the first treatment liquid is excessively high (i.e., a pH value of the first treatment liquid is low). Here, the controller 10 determines whether or not the concentration of the hydrogen ion in the first treatment liquid is high. The controller 10 also determines whether or not the pH value of the first treatment liquid is low. The controller 10 controls the first supplementing unit 28 in accordance with the detection results of the fourth sensor 44.

For example, the second supplementing unit 31 may supplement the second etchant to the first tank 21 in accordance with the detection results of the fourth sensor 44. Specifically, the second supplementing unit 31 may supplement the second etchant to the first tank 21 when a concentration of hydrogen ions in the first treatment liquid is low (i.e., a pH value of the first treatment liquid is high). Here, the controller 10 determines whether or not the concentration of hydrogen ions in the first treatment liquid is low. The controller 10 also determines whether or not the pH value of the first treatment liquid is high. The controller 10 controls the second supplementing unit 31 in accordance with the detection results of the fourth sensor 44.

For example, the first supplementing unit 28 and the second supplementing unit 31 may supplement the solvent (deionized water) and the second etchant, respectively, to the first tank 21 in accordance with the detection results of the third sensor 43. Specifically, the first supplementing unit 28 and the second supplementing unit 31 may supplement the solvent (deionized water) and the second etchant, respectively, to the first tank 21 when the amount of the first treatment liquid in the first tank 21 is small. The controller 10 controls the first supplementing unit 28 and the second supplementing unit 31 in accordance with the detection results of the third sensor 43.

When the second supplementing unit 31 supplements the second etchant to the first tank 21, the adjusting step may be or may not be executed. When the second supplementing unit 31 supplements the second etchant to the first tank 21, the exhaust unit 27 preferably opens inside of the first tank 21 toward outside of the first tank 21. The pump 37 preferably operates even when the second supplementing unit 31 supplements the second etchant to the first tank 21.

As described above, the first treatment liquid is adjusted in the adjusting step (by adjusting unit 23). The first treatment liquid, adjusted in the adjusting step (by adjusting unit 23), contains a sufficient amount of iodide ions (I$^-$). Moreover, the first treatment liquid adjusted in the adjusting step (by adjusting unit 23) contains the second etchant. Accordingly, the first treatment liquid, adjusted in the adjusting step (by adjusting unit 23) contains hydrogen ions (H$^+$).

The liquid feeding unit 56 feeds the first treatment liquid adjusted in the adjusting step (by adjusting unit 23) to the first nozzle 15*a*. Specifically, the valve 57*b* opens while the pump 37 operates. The first treatment liquid flows from the circulation pipe 36 to the pipe 57*a*. The liquid feeding unit 56 feeds the first treatment liquid to the pipe 17*a*.

The supplying step is executed when the valve 18*a* opens. In the supplying step, the first nozzle 15*a* dispenses the first treatment liquid to the substrate W.

<4-3. Effect of Third Embodiment>

The third embodiment produces a similar effect to that of the first embodiment.

The additive is dissolved in the first treatment liquid. The first treatment liquid contains the additive dissolved in the first treatment liquid. The first treatment liquid contains iodide ions (I$^-$). The substrate treating method in the third embodiment includes the adjusting step and the supplying step. In the adjusting step, decrease in iodide ions (I$^-$) contained in the first treatment liquid is suppressed. Accordingly, the first treatment liquid contains a sufficient amount of iodide ions (I$^-$). Moreover, the first treatment liquid contains the second etchant. The second etchant contains hydrogen ions (H$^+$). As a result, the first treatment liquid contains hydrogen ions (H$^+$). In summary, the first treatment liquid adjusted in the adjusting step contains a sufficient amount of iodide ions (I$^-$). The first treatment liquid also contains hydrogen ions (H$^+$). In the supplying step, the first treatment liquid adjusted in the adjusting step is supplied to the substrate. This causes iodide ions (I$^-$) to enter the recesses A easily along with the hydrogen ions (H$^+$) regardless of a size of the recesses A on the substrate W. This causes the hydrogen ions (H$^+$) to enter the recesses A easily along with the iodide ions (I$^-$) immediately after the first treatment liquid is supplied to the substrate W. As a result, the substrates W can be etched suitably regardless of a size of recesses A.

As described above, with the substrate treating method according to the third embodiment, the substrates W can be etched suitably regardless of the size of recesses A on the substrates W.

The second etchant contains hydrogen ions ($H^+$). Accordingly, the substrates W can be etched suitably.

The second etchant includes at least either hydrofluoric acid (HF) or buffered hydrofluoric acid (BHF). Accordingly, the substrates W can be etched suitably.

The first treatment liquid contains alcohol. Accordingly, the substrates W can be etched more suitably.

The first treatment liquid contains at least one selected from the alcohols b1) to b7) described above. Accordingly, the substrates W can be etched more suitably.

The first treatment liquid contains at least one selected from the acids c1) to c7) described above. Accordingly, the substrates W can be etched more suitably.

The adjusting unit 23 removes dissolved oxygen in the first treatment liquid from the first treatment liquid. Accordingly, decrease in iodide ions ($I^-$) contained in the first treatment liquid is suppressed. As a result, the first treatment liquid adjusted by the adjusting unit 23 contains a sufficient amount of iodide ions ($I^-$). Moreover, the first treatment liquid contains the second etchant. The second etchant contains hydrogen ions ($H^+$). As a result, the first treatment liquid contains hydrogen ions ($H^+$). In summary, the first treatment liquid adjusted by the adjusting unit 23 contains a sufficient amount of iodide ions ($I^-$). The first treatment liquid also contains hydrogen ions ($H^+$). The first nozzle 15a supplies the first treatment liquid adjusted by the adjusting unit 23 to the substrate W. This causes the iodide ions ($I^-$) to enter the recesses A easily along with the hydrogen ions ($H^+$) regardless of a size of the recesses A on the substrate W. This causes the hydrogen ions ($H^+$) to enter the recesses A easily along with the iodide ions ($I^-$) immediately after the first treatment liquid is supplied to the substrate W. As a result, the substrates W can be etched suitably regardless of a size of recesses A.

As described above, with the substrate treating apparatus 1 according to the third embodiment, the substrates W can be etched suitably regardless of the size of recesses A on the substrates W.

The substrate treating apparatus 1 includes the fourth sensor 44. The fourth sensor 44 detects a concentration of hydrogen ions in the first treatment liquid. The controller 10 obtains detection results of the fourth sensor 44. Accordingly, the controller 10 can monitor the concentration of hydrogen ions in the first treatment liquid suitably.

The substrate treating apparatus 1 includes the first supplementing unit 28 and the second supplementing unit 31. The first supplementing unit 28 supplements the solvent (deionized water) to the first treatment liquid. The second supplementing unit 31 supplements the second etchant to the first treatment liquid. The controller 10 controls the first supplementing unit 28 and the second supplementing unit 31 in accordance with the detection results of the fourth sensor 44. Accordingly, the controller 10 can keep the concentration of the second etchant in the first treatment liquid suitably.

The substrate treating apparatus 1 includes the third sensor 43. The controller 10 controls the first supplementing unit 28 and the second supplementing unit 31 in accordance with the detection results of the third sensor 43. Accordingly, the controller 10 can supplement the solvent (deionized water) and the second etchant to the first tank 21 while keeping the concentration of the second etchant in the first treatment liquid suitably. For example, there is sometimes a case where the first treatment liquid evaporates and the amount of the first treatment liquid stored in the first tank 21 is reduced when the adjusting unit 23 removes dissolved oxygen in the first treatment liquid from the first treatment liquid. Even in such a case as above, the controller 10 can keep the amount of the first treatment liquid stored in the first tank 21 suitably.

5. Fourth Embodiment

The following describes a substrate treating apparatus 1 according to a fourth embodiment with reference to the drawings. Like numerals are used to identify like components which are the same as those in the first embodiment, and the components will not particularly be described.

The fourth embodiment has an outline of a substrate treating apparatus 1 and a construction of treating units 11 substantially same as those in the first embodiment. The following describes a construction of a treatment liquid adjusting unit 20 according to the fourth embodiment.

<5-1. Construction of Treatment Liquid Adjusting Unit 20>

Figure 9:
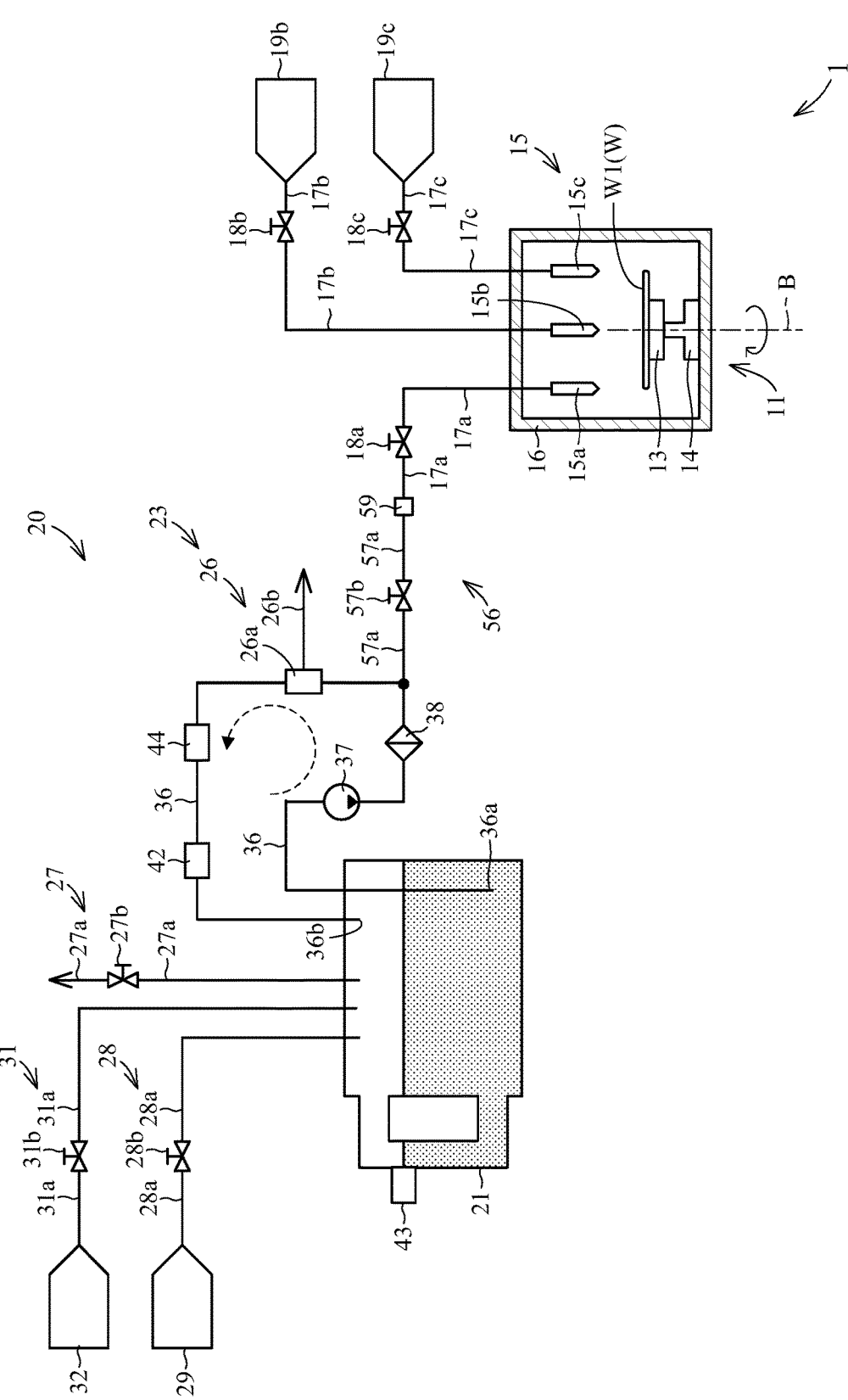
FIG. 9 shows a construction of a treating unit and a treatment liquid adjusting unit according to a fourth embodiment.

FIG. 9 shows the construction of a treating unit 11 and a treatment liquid adjusting unit 20 according to the fourth embodiment. In the fourth embodiment, the treatment liquid adjusting unit 20 adjusts a first treatment liquid. The treatment liquid adjusting unit 20 supplies the adjusted first treatment liquid to the first nozzle 15a. The treatment liquid adjusting unit 20 of the fourth embodiment differs from the treatment liquid adjusting unit 20 of the third embodiment in construction of the adjusting unit 23.

The first tank 21 stores the first treatment liquid.

The first treatment liquid in the fourth embodiment is substantially same as the first treatment liquid in the third embodiment. The first treatment liquid in the fourth embodiment has substantially the same composition as that of the first treatment liquid in the third embodiment. The first treatment liquid contains an additive. The additive is dissolved in the first treatment liquid. The first treatment liquid contains iodide ions ($I^-$). The first treatment liquid further contains a second etchant for etching the substrate W. The second etchant is adjusted by the adjusting unit 23.

The adjusting unit 23 degases the first treatment liquid. Accordingly, the adjusting unit 23 suppresses decrease in iodide ions ($I^-$) contained in the first treatment liquid. Specifically, the adjusting unit 23 includes the gas-liquid separating unit 26. The gas-liquid separating unit 26 is provided in the circulation pipe 36. The gas-liquid separating unit 26 has already been described in the second embodiment.

<5-2. Operation Example of Treatment Liquid Adjusting Unit 20>

The treatment liquid adjusting unit 20 operates in accordance with control by the controller 10.

The treatment liquid adjusting unit 20 executes an adjusting step. In the adjusting step, the pump 37 operates. The first treatment liquid circulates in the circulation pipe 36. The gas-liquid separating unit 26 degases the first treatment liquid flowing in the circulation pipe 36. The degassed first treatment liquid returns back to the first tank 21.

As described above, the first treatment liquid is adjusted in the adjusting step (by adjusting unit 23). The first treatment liquid, adjusted in the adjusting step (by adjusting unit 23), contains a sufficient amount of iodide ions ($I^-$). Moreover, the first treatment liquid adjusted in the adjusting step (by adjusting unit 23) contains the second etchant. The first treatment liquid adjusted in the adjusting step (by adjusting unit 23) contains hydrogen ions ($H^+$).

The liquid feeding unit 56 feeds the first treatment liquid adjusted in the adjusting step (by adjusting unit 23) to the first nozzle 15a. Specifically, the valve 57b opens while the pump 37 operates. Accordingly, the adjusting step is executed even when the liquid feeding unit 56 feeds the first treatment liquid to the first nozzle 15a.

<5-4. Effect of Fourth Embodiment>

The fourth embodiment produces a similar effect to that of the first embodiment.

Moreover, in the adjusting step of the substrate treating method according to the fourth embodiment, the first treatment liquid is degassed. Accordingly, in the adjusting step, decrease in iodide ions ($I^-$) contained in the first treatment liquid can be suppressed satisfactorily.

In the adjusting step, the gas-liquid separating unit 26 filters the first treatment liquid to degas the first treatment liquid. Accordingly, in the adjusting step, the first treatment liquid can be degassed satisfactorily.

The adjusting unit 23 includes the gas-liquid separating unit 26. Accordingly, the adjusting unit 23 can degas the first treatment liquid suitably. Accordingly, the adjusting unit 23 can decrease the concentration of dissolved oxygen in the first treatment liquid satisfactorily.

Moreover, the gas-liquid separating unit 26 can degas the first treatment liquid without evaporation of the first treatment liquid (e.g., deionized water). Accordingly, the adjusting unit 23 can decrease the concentration of dissolved oxygen in the first treatment liquid satisfactorily while decrease of the first treatment liquid stored in the first tank 21 is suppressed.

This invention is not limited to the foregoing examples, but may be modified as follows.

(1) In the first and second embodiments, the first treatment liquid is an aqueous solution in which the additive is dissolved in deionized water. However, the present invention is not limited to this. For example, the first treatment liquid may also contain the second etchant. For example, the first treatment liquid may contain at least one selected from the alcohols b1) to b7) described above. For example, the first treatment liquid may contain at least one selected from the acids c1) to c7) described above.

(2) In the first and second embodiments, the mixed liquid of the first treatment liquid and the first etchant is supplied to the substrate W in the supplying step. However, the present invention is not limited to this. In the supplying step, the first treatment liquid and the first etchant may be supplied to the substrate W individually.

Figure 10:
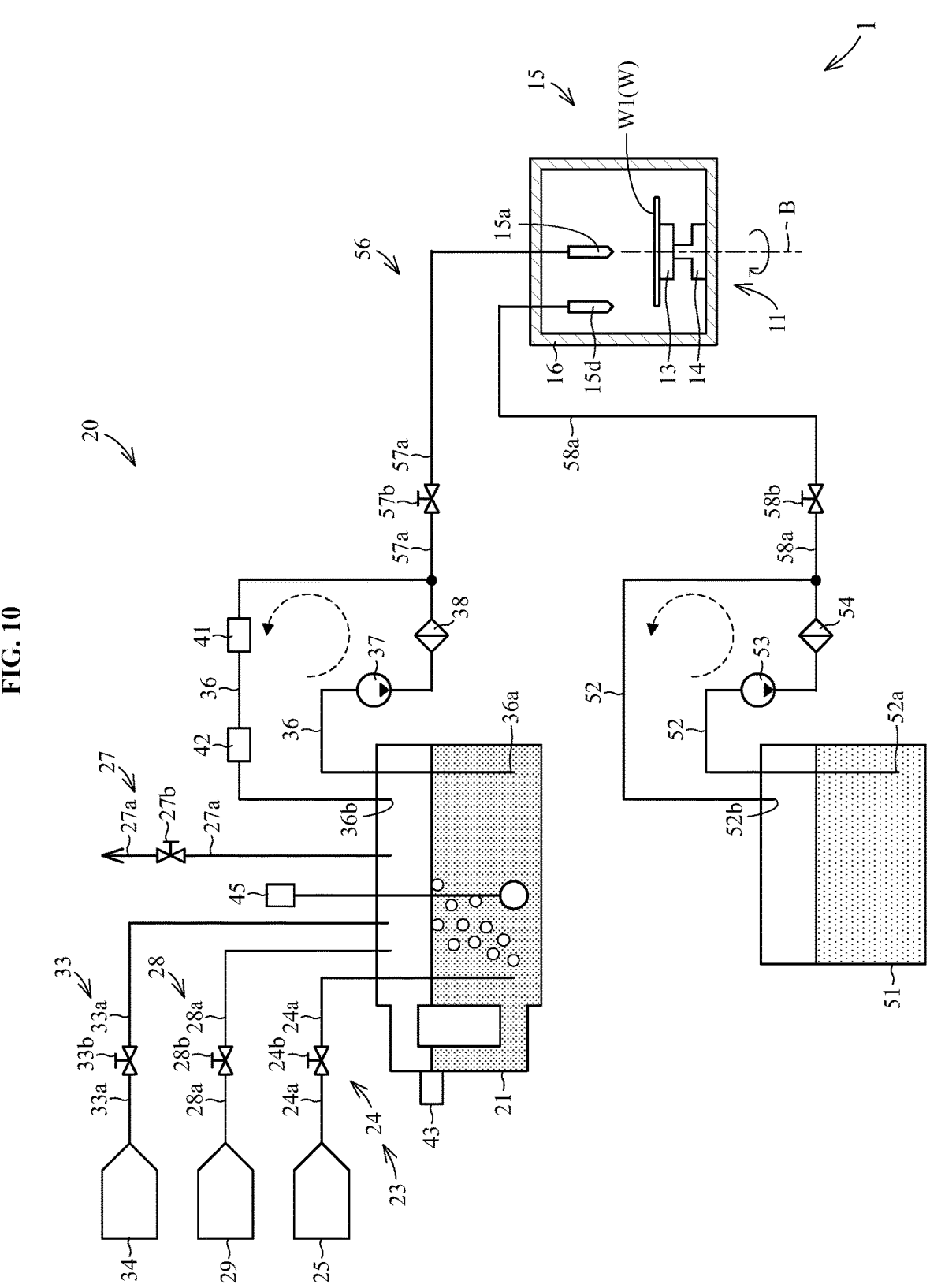
FIG. 10 shows a construction of a treating unit and a treatment liquid adjusting unit according to one modification.

FIG. 10 shows a construction of a treating unit 11 and a treatment liquid adjusting unit 20 according to one modification. Like numerals are used to identify like components which are the same as those in the first embodiment, and the components will not particularly be described. The treating unit 11 includes a fourth nozzle 15d in addition to the first nozzle 15a. Here in FIG. 10, illustration of second and third nozzles 15b and 15c is omitted.

The pipe 57a of the liquid feeding unit 56 is connected to the first nozzle 15a. The pipe 58a of the liquid feeding unit 56 is connected to the fourth nozzle 15d. The pipe 57a is not connected to the pipe 58a. The pipe 57a is not connected to the fourth nozzle 15d. The pipe 58a is not connected to the first nozzle 15a. Accordingly, the liquid feeding unit 56 feeds the first treatment liquid to the first nozzle 15a. The liquid feeding unit 56 does not feed the first etchant to the first nozzle 15a. The liquid feeding unit 56 feeds the first etchant to the fourth nozzle 15d. The liquid feeding unit 56 does not feed the first treatment liquid to the fourth nozzle 15d.

As a result, the first nozzle 15a dispenses the first treatment liquid to the substrate W held by the substrate holder 13. The fourth nozzle 15d dispenses the first etchant to the substrate W held by the substrate holder 13. After the first nozzle 15a and the fourth nozzle 15d dispenses the first treatment liquid and the first etchant, respectively, the first treatment liquid is added to the first etchant. The first treatment liquid is added to the first etchant on the substrate W (pattern formation face W1). This modification can also etch the substrate W suitably.

Both the first nozzle 15a and the fourth nozzle 15d correspond to one example of the supplying unit in the present invention.

(3) In the first to fourth embodiments, the treating unit 11 is classified as the single-wafer processing unit. However, the present invention is not limited to this. For example, the treating unit 11 may be classified as a batch type processing unit. That is, the treating units 11 may perform treatment on a plurality of substrates W at one time.

Here, the treating units 11 may each include a process tank and a substrate holding mechanism, which illustration is omitted. The process tank stores a treatment liquid. The treatment liquid is a mixed liquid of the first treatment liquid and the first etchant, for example. Alternatively, the treatment liquid is the first treatment liquid containing the second etchant, for example. The substrate holding mechanism holds a plurality of substrates W within the process tank. The substrate holding mechanism immerses a plurality of the substrates W in the treatment liquid stored in the process tank.

Here, the process tank of the treating unit 11 may be provided separately from the first tank 21 and the second tank 51 of the treatment liquid adjusting unit 20. Alternatively, the first tank 21 or the second tank 51 of the treatment liquid adjusting unit 20 may be used as the process tank of the treating unit 11.

The process tank corresponds to one example of the supplying unit in the present invention.

(4) In the first to fourth embodiments, the adjusting unit 23 includes either the gas bubble generating unit 24 or the gas-liquid separating unit 26. However, the present invention is not limited to this. The adjusting unit 23 may include both the gas bubble generating unit 23 and the gas-liquid separating unit 26.

(5) In the first and second embodiments, the first and second sensors 41 and 42 are provided on the circulation pipe 36. However, the present invention is not limited to this. For example, at least either the first sensor 41 or the second sensor 42 may be provided on the first tank 21. For example, the first sensor 41 may detect a concentration of iodide ions ($I^-$) in the first treatment liquid within the first tank 21. For example, the second sensor 42 may detect a concentration of dissolved oxygen in the first treatment liquid within the first tank 21.

(6) In the third and fourth embodiments, the substrate treating apparatus 1 does not include the first sensor 41. However, the present invention is not limited to this. In the third and fourth embodiments, the substrate treating apparatus 1 may include the first sensor 41.

(7) In the first to fourth embodiments, an oxidation-reduction potential of the first treatment liquid may be detected.

Reference is made to FIG. 10. The treatment liquid adjusting unit 20 of the modification includes a fifth sensor

45. The fifth sensor 45 detects an oxidation-reduction potential of the first treatment liquid. Specifically, the fifth sensor 45 detects an oxidation-reduction potential of the first treatment liquid within the first tank 21. The fifth sensor is, for example, an oxidation-reduction potential meter.

The controller 10 obtains detection results of the fifth sensor 45, which illustration is omitted. The controller 10 monitors the detection results of the fifth sensor 45, for example.

In this modification, the oxidation-reduction potential of the first treatment liquid is detected in the adjusting step. Accordingly, in the adjusting step, the concentration of iodide ions ($I^-$) in the first treatment liquid can be estimated suitably. This is because the Inventors found that a constant relationship is present between the oxidation-reduction potential of the first treatment liquid and composition change of iodide ions ($I^-$). For example, composition change of iodide ions ($I^-$) to iodine molecules ($I_2$) or the triiodide ions ($I^-$) is difficult when the oxidation-reduction potential falls below a given value. Accordingly, when the oxidation-reduction potential falls below the given value, for example, it is estimated that a concentration of iodide ions ($I^-$) in the first treatment liquid is high.

At least one selected from a concentration of iodide ions ($I^-$) in the first treatment liquid, an oxidation-reduction potential in the first treatment liquid, and a concentration of dissolved oxygen in the first treatment liquid may be detected in the adjusting step.

For example, the adjusting step may start in accordance with detection results of the fifth sensor 45. For example, the adjusting step may start when the oxidation-reduction potential of the first treatment liquid is high. Here, the controller 10 determines whether or not the oxidation-reduction potential in the first treatment liquid is high. The controller 10 determines a timing of starting the adjusting step in accordance with detection results of the fifth sensor 45.

For example, the adjusting step may end in accordance with detection results of the fifth sensor 45. For example, the adjusting step may end when the oxidation-reduction potential of the first treatment liquid is low. Here, the controller 10 determines whether or not the oxidation-reduction potential in the first treatment liquid is low. The controller 10 determines a timing of ending the adjusting step in accordance with detection results of the fifth sensor 45.

For example, the adjusting step may start in accordance with at least one selected from a detection result of the concentration of iodide ions ($I^-$) in the first treatment liquid, a detection result of the oxidation-reduction potential in the first treatment liquid, and a detection result of the concentration of the dissolved oxygen in the first treatment liquid. For example, the adjusting step may end in accordance with at least one selected from a detection result of the concentration of iodide ions ($I^-$) in the first treatment liquid, a detection result of the oxidation-reduction potential in the first treatment liquid, and a detection result of the concentration of dissolved oxygen in the first treatment liquid.

For example, the solvent of the additive (i.e., deionized water) may be supplemented to the first treatment liquid in accordance with the detection results of the fifth sensor 45 in the adjusting step. For example, the first supplementing unit 28 may supplement the solvent (deionized water) to the first tank 21 in accordance with the detection results of the fifth sensor 45. For example, the controller 10 may control the first supplementing unit 28 in accordance with the detection results of the fifth sensor 45.

For example, the solvent of the additive (i.e., solvent) may be supplemented to the first treatment liquid in accordance with at least one selected from a detection result of the concentration of iodide ions ($I^-$) in the first treatment liquid, a detection result of the oxidation-reduction potential in the first treatment liquid, and a detection result of the concentration of dissolved oxygen in the first treatment liquid.

(8) In the first to fourth embodiments, the substrate treating apparatus 1 may have a construction of supplementing the additive to the first treatment liquid.

Reference is made to FIG. 10. The treatment liquid adjusting unit 20 includes a third supplementing unit 33. The third supplementing unit 33 supplements the additive to the first treatment liquid. Specifically, the third supplementing unit 33 supplements the additive to the first tank 21.

The third supplementing unit 33 includes a pipe 33a and a valve 33b. The pipe 33a is in fluid communication with the first tank 21. The pipe 33a is connected to the first tank 21. The pipe 33a is also in fluid communication with an additive supplying source 34. The pipe 33a is connected to the additive supplying source 34. The valve 33b is provided on the pipe 33a. When the valve 33b is opened, the pipe 33a supplies the additive to the first tank 21.

The controller 10 controls the third supplementing unit 33.

In the adjusting step, at least either the additive or the solvent of the additive (deionized water) may be supplemented to the first treatment liquid in accordance with at least one selected from a detection result of the concentration of iodide ions ($I^-$) in the first treatment liquid, a detection result of the oxidation-reduction potential in the first treatment liquid, and a detection result of the concentration of dissolved oxygen in the first treatment liquid. The controller 10 may control at least either the first supplementing unit 28 or the third supplementing unit 33 in accordance with at least one selected from the first sensor 41, the second sensor 42, and the fifth sensor 45. With this modification, the concentration of iodide ions ($I^-$) in the first treatment liquid can be adjusted suitably.

(9) In the first and third embodiments, inert gas is supplied into the first treatment liquid to generate gas bubbles in the first treatment liquid in the adjusting step. In the second and fourth embodiments, the first treatment liquid is degassed in the adjusting step. However, the present invention is not limited to this. In the first to fourth embodiments, inert gas may be supplied into the first treatment liquid to generate gas bubbles in the first treatment liquid, and the first treatment liquid may be degassed in the adjusting step. In the first to fourth embodiments, at least either supplying of inert gas into the first treatment liquid to generate gas bubbles in the first treatment liquid or degassing of the first treatment liquid may be performed in the adjusting step. The adjusting unit 23 may include both the gas bubble generating unit 24 and the gas-liquid separating unit 26. The adjusting unit 23 may include at least either the gas bubble generating unit 24 or the gas-liquid separating unit 26.

(10) In the first and second embodiments, the first treatment liquid is added to the first etchant at the joint 59. However, the present invention is not limited to this. The liquid feeding unit 56 may include a mixer or a mixing valve for mixing the first treatment liquid and the first etchant. The first treatment liquid may be added to the first etchant in the mixer or the mixing valve.

(11) In the first to fourth embodiments, the pipe 57a is connected to the circulation pipe 36. Accordingly, the liquid feeding unit 56 feeds the first treatment liquid, flowing in the circulation pipe 36, to the first nozzle 15a. However, the present invention is not limited to this. The pipe 57a of the liquid feeding unit 56 may be connected to the first tank 21.

The liquid feeding unit 56 may feed the first treatment liquid in the first tank 21 to the first nozzle 15*a*. The pipe 58*a* of the liquid feeding unit 56 in the first and second embodiments may be modified in the same manner as above.

(12) The first to fourth embodiments and each of the modified embodiments described in paragraphs (1) to (11) above may be further varied as appropriate by replacing or combining their constructions with the constructions of the other modified embodiments.

REFERENCE SIGNS LIST

1 . . . substrate treating apparatus
10 . . . controller
11 . . . treating unit
13 . . . substrate holder
15*a* . . . first nozzle (supplying unit)
15*b* . . . second nozzle
15*c* . . . third nozzle
15*d* . . . fourth nozzle (supplying unit)
20 . . . treatment liquid adjusting unit
21 . . . first tank
23 . . . adjusting unit
24 . . . gas bubble generating unit
24*a* . . . pipe
24*b* . . . valve
26 . . . gas-liquid separating unit
26*a* . . . degassing filter
26*b* . . . exhaust pipe
27 . . . exhaust unit
28 . . . first supplementing unit (solvent of additive (deionized water))
31 . . . second supplementing unit (second etchant)
33 . . . third supplementing unit (additive)
41 . . . first sensor (concentration of iodide ion)
42 . . . second sensor (concentration of dissolved oxygen)
43 . . . third sensor (liquid level sensor)
44 . . . fourth sensor (pH meter)
45 . . . fifth sensor (oxidation-reduction potential meter)
51 . . . second tank
56 . . . liquid feeding unit
59 . . . joint
A . . . recess
W . . . substrate
W1 . . . pattern formation face
W2 . . . projection
X . . . front-back direction
Y . . . transverse direction
Z . . . vertical direction
The invention claimed is:

1. A substrate treating method for performing treatment on a substrate, the substrate treating method comprising:
   an adjusting step of suppressing decrease in iodide ions (I) contained in a first treatment liquid where an additive is dissolved; and
   a supplying step of supplying the first treatment liquid, adjusted in the adjusting step, and a first etchant for etching the substrate to the substrate, wherein
   a concentration of dissolved oxygen in the first treatment liquid is lowered in the adjusting step.

2. The substrate treating method according to claim 1, wherein
   in the supplying step, a mixed liquid, generated by adding the first treatment liquid adjusted in the adjusting step to the first etchant, is supplied to the substrate.

3. The substrate treating method according to claim 1, wherein the first treatment liquid is an aqueous solution in which the additive is dissolved in deionized water.

4. The substrate treating method according to claim 1, wherein
   the additive releases the iodide ions (I) therefrom into the first treatment liquid.

5. The substrate treating method according to claim 1, wherein
   the additive contains at least one selected from tetramethylammonium iodide (TMAI), tetraethylammonium iodide (TEAI), tetrapropylammonium iodide (TPAI), tetrabutylammonium iodide, ammonium iodide, and hydrogen iodide.

6. The substrate treating method according to claim 1, wherein
   inert gas is supplied into the first treatment liquid to generate gas bubbles in the first treatment liquid in the adjusting step.

7. The substrate treating method according to claim 1, wherein
   at least one selected from a concentration of the iodide ions (I) in the first treatment liquid, an oxidation-reduction potential in the first treatment liquid, and a concentration of dissolved oxygen in the first treatment liquid is detected in the adjusting step.

8. The substrate treating method according to claim 7, wherein
   the adjusting step starts and ends in accordance with at least one selected from a detection result of the concentration of the iodide ions (I) in the first treatment liquid, a detection result of the oxidation-reduction potential in the first treatment liquid, and a detection result of the concentration of the dissolved oxygen in the first treatment liquid.

9. The substrate treating method according to claim 7, wherein
   at least either the additive or a solvent of the additive is supplemented to the first treatment liquid in accordance with at least one selected from a detection result of the concentration of the iodide ions (I) in the first treatment liquid, a detection result of the oxidation-reduction potential in the first treatment liquid, and a detection result of the concentration of the dissolved oxygen in the first treatment liquid.

10. A substrate treating method for performing treatment on a substrate, the substrate treating method comprising:
    an adjusting step of suppressing decrease in iodide ions (I) contained in a first treatment liquid where an additive is dissolved; and
    a supplying step of supplying the first treatment liquid adjusted in the adjusting step to the substrate, wherein
    the first treatment liquid further contains an etchant for etching the substrate, and
    a concentration of dissolved oxygen in the first treatment liquid is lowered in the adjusting step.

11. A substrate treating method for performing treatment on a substrate, the substrate treating method comprising:
    an adjusting step of suppressing decrease in iodide ions (I) contained in a first treatment liquid where an additive is dissolved; and
    a supplying step of supplying the first treatment liquid, adjusted in the adjusting step, and a first etchant for etching the substrate to the substrate, wherein
    the first treatment liquid is degassed in the adjusting step.

12. The substrate treating method according to claim 11, wherein a gas-liquid separating unit filters the first treatment liquid to degas the first treatment liquid in the adjusting step.

13. A substrate treating method for performing treatment on a substrate, the substrate treating method comprising:

an adjusting step of suppressing decrease in iodide ions (I) contained in a first treatment liquid where an additive is dissolved; and a supplying step of supplying the first treatment liquid adjusted in the adjusting step to the substrate, wherein the first treatment liquid further contains an etchant for etching the substrate, and the first treatment liquid is degassed in the adjusting step.

\* \* \* \* \*